United States Patent
Sung et al.

(10) Patent No.: US 9,082,464 B2
(45) Date of Patent: Jul. 14, 2015

(54) MEMORY MODULE FOR HIGH-SPEED OPERATIONS

(71) Applicant: Samsung Electronics Co., Ltd., Suwon-Si, Gyeonggi-Do (KR)

(72) Inventors: Myung-Hee Sung, Hwaseong-Si (KR); Chang-Woo Ko, Seoul (KR); Jea-Eun Lee, Seoul (KR); Young-Ho Lee, Seongnam-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 173 days.

(21) Appl. No.: 13/766,933

(22) Filed: Feb. 14, 2013

(65) Prior Publication Data

US 2013/0208524 A1  Aug. 15, 2013

Related U.S. Application Data

(60) Provisional application No. 61/598,621, filed on Feb. 14, 2012.

(30) Foreign Application Priority Data

Jun. 20, 2012  (KR) ........................ 10-2012-0066314

(51) Int. Cl.
*G11C 5/06* (2006.01)
*G11C 5/04* (2006.01)
(Continued)

(52) U.S. Cl.
CPC .. *G11C 5/06* (2013.01); *G11C 5/04* (2013.01); *G11C 7/02* (2013.01); *G11C 7/1057* (2013.01); *G11C 7/1084* (2013.01); *G11C 7/222* (2013.01); *G11C 7/225* (2013.01); *G11C 11/4076* (2013.01); *G11C 11/4093* (2013.01)

(58) Field of Classification Search
CPC ............... G11C 5/06; G11C 5/04; G11C 7/02
USPC ..................................... 365/63, 51
See application file for complete search history.

(56) References Cited

U.S. PATENT DOCUMENTS 6,125,419 A * 9/2000 Umemura et al. ............ 710/110
6,300,789 B1 * 10/2001 Ball ............................... 326/30
(Continued)

FOREIGN PATENT DOCUMENTS

| JP | 2003-173317 | 6/2003 |
| JP | 2008-135597 | 6/2008 |
| KR | 10-2007-0046697 | 5/2007 |

OTHER PUBLICATIONS

English Abstract for Publication No. 2003-173317, Jun. 2003.
(Continued)

*Primary Examiner* — Viet Q Nguyen
(74) *Attorney, Agent, or Firm* — F. Chau & Associates, LLC

(57) ABSTRACT

A memory module includes a plurality of buses. A plurality of memory chips is mounted on a module board and is connected to a first node, a second node, and a plurality of third nodes of the plurality of buses. The first node, the second node, and the third nodes branch off to a first memory chip, a second memory chip, and the third memory chips, respectively. A length of the plurality of buses between the first and second nodes is longer than a length of the plurality of buses between adjacent nodes from among the second node and the third nodes.

20 Claims, 26 Drawing Sheets

(51) Int. Cl.

| | | |
|---|---|---|
| G11C 7/02 | (2006.01) | |
| G11C 7/10 | (2006.01) | |
| G11C 7/22 | (2006.01) | |
| G11C 11/4076 | (2006.01) | |
| G11C 11/4093 | (2006.01) | |

(56) References Cited

U.S. PATENT DOCUMENTS

| | | | |
|---|---|---|---|
| 6,687,780 B1 * | 2/2004 | Garlepp et al. | 710/305 |
| 6,766,404 B1 * | 7/2004 | Osaka et al. | 710/306 |
| 6,783,382 B2 * | 8/2004 | Felps | 439/314 |
| 6,927,992 B1 * | 8/2005 | Yen | 365/63 |
| 6,937,494 B2 * | 8/2005 | Funaba et al. | 365/63 |
| 6,978,328 B1 * | 12/2005 | Osaka et al. | 710/107 |
| 7,000,062 B2 * | 2/2006 | Perego et al. | 711/5 |
| 7,061,784 B2 * | 6/2006 | Jakobs et al. | 365/51 |
| 7,133,962 B2 * | 11/2006 | Leddige et al. | 711/105 |
| 7,177,998 B2 * | 2/2007 | Ware et al. | 711/167 |
| 7,257,725 B2 * | 8/2007 | Osaka et al. | 713/500 |
| 7,339,840 B2 | 3/2008 | Wallner et al. | |
| 7,375,971 B2 * | 5/2008 | RaghuRam et al. | 361/736 |
| 7,529,112 B2 * | 5/2009 | Dreps et al. | 365/51 |
| 7,542,322 B2 * | 6/2009 | McCall et al. | 365/52 |
| 7,562,271 B2 * | 7/2009 | Shaeffer et al. | 714/724 |
| 7,646,212 B2 * | 1/2010 | Sung et al. | 326/30 |
| 7,685,364 B2 * | 3/2010 | Shaeffer et al. | 711/115 |
| 8,054,643 B2 * | 11/2011 | Tsukada | 361/777 |
| 8,134,239 B2 * | 3/2012 | Hiraishi et al. | 257/784 |
| 8,195,855 B2 * | 6/2012 | Jeong et al. | 710/100 |
| 8,199,521 B2 * | 6/2012 | Muff | 361/777 |
| 2007/0019494 A1 | 1/2007 | Moosrainer et al. | |
| 2007/0189049 A1 | 8/2007 | Djordjevic et al. | |
| 2009/0086522 A1 | 4/2009 | Hiraishi et al. | |
| 2010/0070690 A1 | 3/2010 | Amer et al. | |

OTHER PUBLICATIONS

English Abstract for Publication No. 2008-135597, Jun. 2008.
English Abstract for Publication No. 10-2007-0046697, May 2007.

* cited by examiner

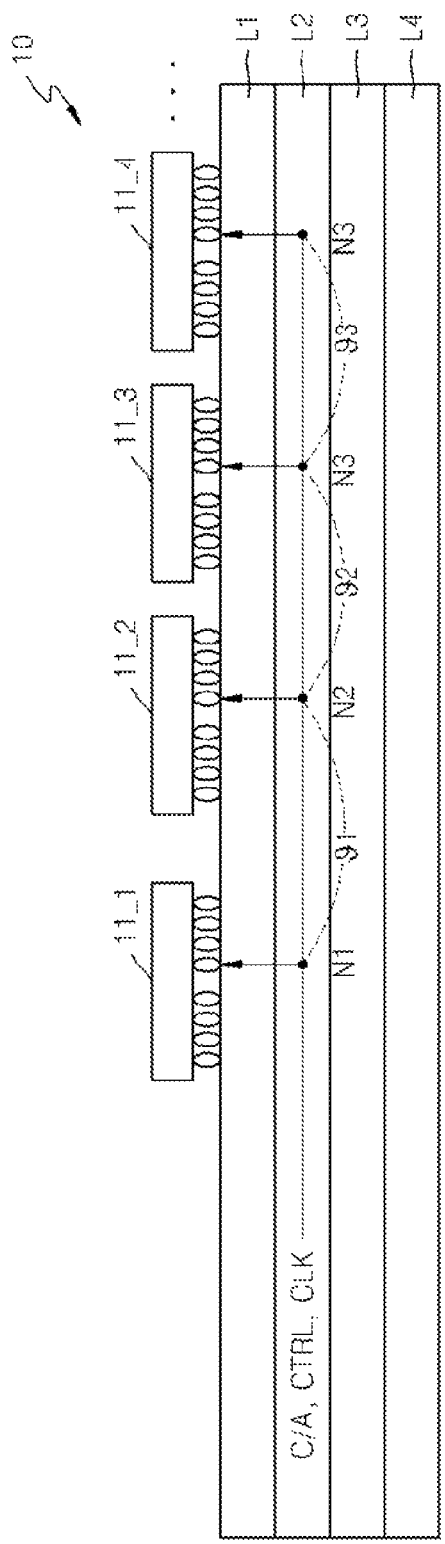

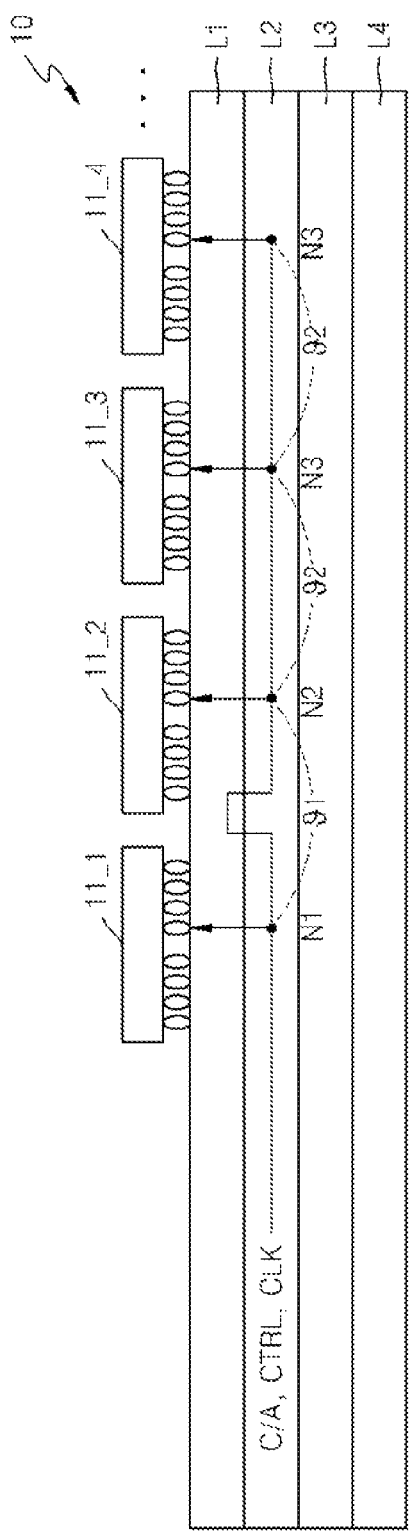

MEMORY MODULE FOR HIGH-SPEED OPERATIONS

CROSS-REFERENCE TO RELATED APPLICATIONS

This application claims the benefit of U.S. Provisional Application No. 61/598,621, filed on Feb. 14, 2012, in the U.S. Patent and Trademark Office, and Korean Patent Application No. 10-2012-0066314, filed on Jun. 20, 2012, in the Korean Intellectual Property Office, the disclosures of which are incorporated herein in their entirety by reference.

TECHNICAL FIELD

The present disclosure relates to a memory module, and more particularly, to a memory module having signal integrity during high-speed operations thereof.

DISCUSSION OF THE RELATED ART

In general, a memory module including a plurality of memory devices mounted on a module board is employed as a data storage memory in data processing systems such as personal computers (PCs), workstations, server computers, or communication systems.

Recently, operating frequencies of memory devices mounted on memory modules have become higher to increase operating speeds of such data processing systems. Signal distortion may result from the higher operating frequencies as signal reflection and signal interference may occur in the transmission lines. Accordingly, it is difficult to secure signal integrity, thereby limiting high-speed operations of the data processing systems.

Double-data-rate (DDR) memory has been developed to provide increased access speed. These memories transmit data in synchronization with both a rising edge and a falling edge of a system clock signal. DDR memories are a type of synchronous dynamic random access memory (SDRAM). Examples of DDR SDRAM include DDR2 SDRAM and DDR3 SDRAM. As the operating speeds for these memory devices are particularly high, securing signal integrity is an important concern.

SUMMARY

One or more aspects of the inventive concept provide a memory module capable of having high signal integrity and accurately performing high-speed operations even when an operating frequency is high.

According to an aspect of the inventive concept, there is provided a memory module including a plurality of buses and a plurality of memory chips. The memory chips are mounted on a module board and are connected to a first node, a second node, and a plurality of third nodes of the plurality of buses. The first node, the second node, and the third nodes branch off to a first memory chip, a second memory chip, and the other memory chips, starting from a front end of the plurality of buses. A bus length between the first and second nodes is longer than bus lengths between adjacent nodes from among the second node and the third nodes.

The bus lengths between adjacent nodes from among the second node and the third nodes may be the same.

The memory module may further include a buffer chip mounted on the module board. The buffer chip may control operations of the plurality of memory chips.

The plurality of memory chips may be disposed on an upper surface and a lower surface of the module board in at least one row at both sides of the buffer chip. The memory chips on the upper surface of the module board and the memory chips on the lower surface of the module board may correspond to each other. Each of the plurality of buses includes a command/address signal bus having a split fly-by structure. A command/address signal provided from the buffer chip is transmitted to the memory chips disposed on the upper and lower surfaces of the module board. The command/address signals are provided to the first node, the second node, and the plurality of third nodes, via the command/address signal bus.

The plurality of memory chips may be disposed on an upper surface and a lower surface of the module board in at least one row at both sides of the buffer chip. The memory chips on the upper surface of the module board and the memory chips on the lower surface of the module board may correspond to each other. Each of the plurality of buses may include a control signal bus having a split fly-by structure. A control signal provided from the buffer chip may be transmitted to the memory chips disposed on the upper and lower surfaces of the module board. The control signal may be provided to the first node, the second node, and the plurality of third nodes, via the control signal bus.

The plurality of memory chips may be disposed on an upper surface and a lower surface of the module board in at least one row at both sides of the buffer chip. The memory chips on the upper surface of the module board and the memory chips on the lower surface of the module board may correspond to each other. Each of the plurality of buses includes a clock signal bus having a fly-by structure. A clock signal provided from the buffer chip may be transmitted to the memory chips disposed on the upper and lower surfaces of the module board. The clock signal may be provided to the first node, the second node, and the plurality of third nodes, via the clock signal bus.

The memory module may further include at least one data buffer chip mounted on the module board. The at least one data buffer chip may buffer data exchanged between the memory controller and the plurality of memory chips.

The plurality of memory chips may be disposed on an upper surface and a lower surface of the module board in at least one row along the plurality of buses. The memory chips on the upper surface of the module board and the memory chips on the lower surface of the module board may correspond to each other. Each of the plurality of buses may have a fly-by structure. Signals for controlling the plurality of memory chips may be transmitted to the memory chips disposed on the upper and lower surfaces of the module board. The signals for controlling the memory chips may be provided to the first node, the second node, and the plurality of third nodes, via the plurality of buses.

The module board may be a multilayer module board, and the plurality of buses may be formed on at least one layer.

The plurality of memory chips may be double data rate type four (DDR4) type synchronous dynamic random access memory (SDRAM).

The plurality of memory chips may be packaged in one of a mono die structure, a dual die structure, and a stacked die structure using through silicon vias (TSVs).

According to an aspect of the inventive concept, there is provided a memory module including a plurality of buses. A plurality of memory chips is mounted on a module board. The memory chips are connected to a first node, a second node, a plurality of third nodes, a fourth node, and a fifth node of the plurality of buses. The first node and the second node respectively branch off to a first memory chip and a second memory chip starting from a front end of the plurality of buses. The fourth node and the fifth node respectively branch off to a first memory chip and a second memory chip starting from a last end of the plurality of buses. The third nodes branch off to the other memory chips except for the memory chips connected to the first node, the second node, the fourth node, and the fifth node. A bus length between the first node and the second node and a bus length between the fourth node and the fifth node are longer than bus lengths between adjacent nodes from among the third nodes.

The plurality of memory chips may be disposed on an upper surface and a lower surface of the module board in a first row and a second row. Memory chips connected to the first node, the second node, the fourth node, and the fifth node may be arranged in the first row. Memory chips connected to the third nodes may be arranged in the second row. The plurality of buses may each have a fly-by structure. Signals for controlling the plurality of memory chips may be transmitted to memory chips disposed on the upper surface, the lower surface, or the upper and lower surfaces of the module board and connected to the first to fifth nodes, via the plurality of buses. A bus length between the first node and the second node and a bus length between the fourth node and the fifth node may be equal to or longer than bus lengths between adjacent nodes from among the second node and the third nodes and a bus length between the third node and the fourth node.

BRIEF DESCRIPTION OF THE DRAWINGS

Exemplary embodiments of the inventive concept will be more clearly understood from the following detailed description taken in conjunction with the accompanying drawings in which:

FIGS. 2A and 2B are side cross-sectional views illustrating examples of a bus structure of the memory module of FIG. 1, according to an exemplary embodiment of the inventive concept;

DETAILED DESCRIPTION OF THE EMBODIMENTS

Figure 1:
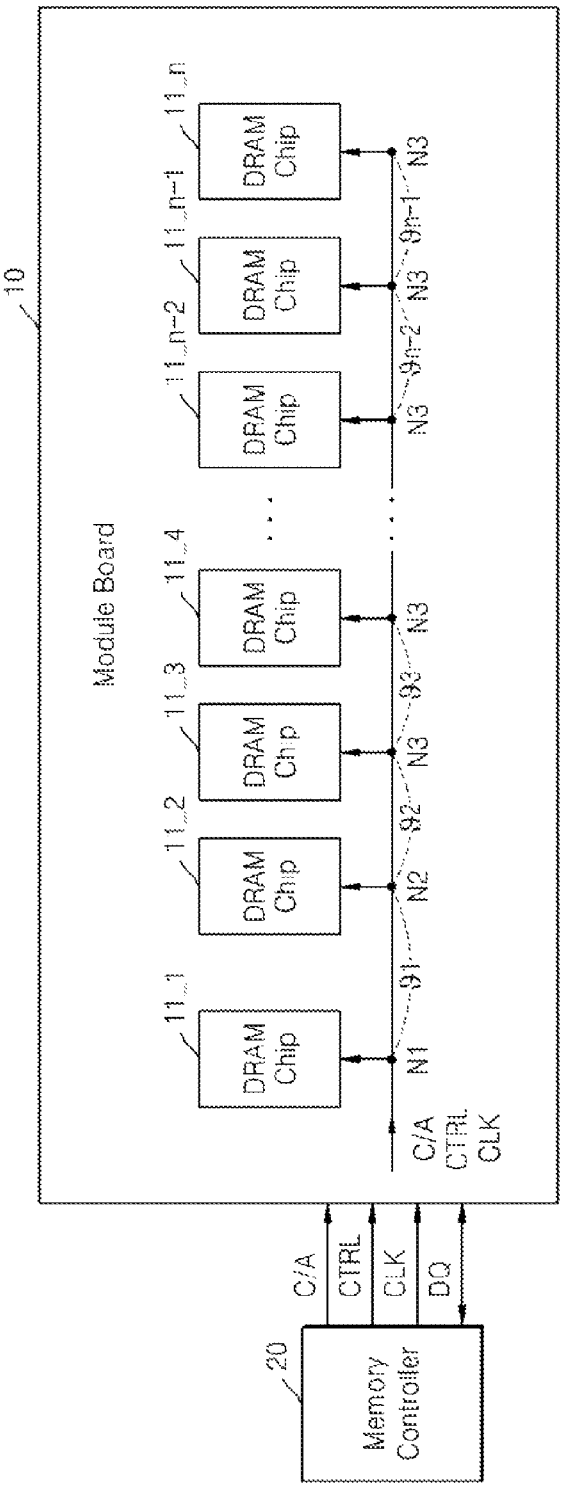
FIG. 1 is a schematic block diagram of a memory module according to an exemplary embodiment of the inventive concept.

Hereinafter, the inventive concept will be described more fully with reference to the accompanying drawings, in which exemplary embodiments of the inventive concept are shown. The inventive concept may, however, be embodied in many different forms and should not be construed as limited to the exemplary embodiments set forth herein. Although some embodiments of the inventive concept have been shown and described, it would be appreciated by those of ordinary skill in the art that changes may be made in these exemplary embodiments without departing from the principles and spirit of the inventive. In the drawings, like reference numerals may denote like elements, and the lengths and sizes of layers and regions may be exaggerated for clarity.

FIG. 1 is a schematic block diagram of a memory module 10 according to an exemplary embodiment of the inventive concept. For convenience of explanation, a memory controller 20 that exchanges data with the memory module 10 and provides commands/address signals and the like to control the memory module 10 is also illustrated in FIG. 1.

Referring to FIG. 1, the memory module 10 may include at least one memory chip. For example, the memory module 10 may include a plurality of memory chips mounted on an upper surface and/or a lower surface of a module board. According to an exemplary embodiment of the inventive concept, the memory module 10 may include a plurality of memory chips 11_1 to 11_$n$ (where 'n' denotes a positive integer) mounted on the upper surface of the module board.

The memory chips 11_1 to 11_$n$ may be disposed along at least one bus and may be adjacent to one another. According to an exemplary embodiment of the inventive concept, the memory chips 11_1 to 11_$n$ may be disposed along a plurality of buses and may be adjacent to one another. For example, the memory chips 11_1 to 11_$n$ may be disposed along a command/address signal bus, a control signal bus, and a clock signal bus and may be adjacent to one another. For convenience of explanation, only one bus is illustrated in FIG. 1.

Each of the memory chips 11_1 to 11_$n$ may be connected to one of the nodes of the buses, which branch off to the memory chips 11_1 to 11_$n$, respectively. For example, each of the memory chips 11_1 to 11_$n$ may be connected to one of a first node N1, a second node N2, and a plurality of third nodes N3. The first and second nodes N1 and N2 may respectively branch off to the first memory chip 11_1 and the second memory chip 11_2 starting from a front end of each of the buses. The third nodes N3 may branch off to the other memory chips 11_3 to 11_n except for the first and second memory chip 11_1 and 11_2. A signal may first be transmitted to the memory chip 11_1 connected to the first node N1, and then be sequentially transmitted to the memory chips 11_2 to 11_n being each connected to one of the second node N2 and the third nodes N3, via the buses.

A bus length θ1 between the first node N1 and the second node N2 of the buses may be longer than bus lengths θ2 to θn−1 between adjacent nodes from among the second node N2 and the third nodes N3. The bus lengths θ2 to θn−1 may be equal to one another.

Here, the bus lengths θ1 to θn−1 between adjacent nodes represents the lengths of signal transmission paths between nodes, and may thus be understood as including not only horizontal paths between nodes on the module board but also vertical paths between nodes on the module board. Thus, the inventive concept is not limited to determining distances between the memory chips 11_1 to 11_n according to the bus lengths θ1 to θn−1 between adjacent nodes. For example, a distance between memory chips 11_1 and 11_2 being respectively connected to the first node N1 and the second node N2 may be set to be greater than distances between the memory chips 11_2 to 11_n each being connected to one of the second node N2 and the third nodes N3, according to bus lengths θ2 to θn−1 between adjacent nodes. Alternatively, the distances between the memory chips 11_1 to 11_n may be the same, and a bus length between the first node N1 and the second node N2 may be longer than bus lengths between the other adjacent nodes, as will be described in detail with reference to FIGS. 2A and 2B below.

Each of the memory chips 11_1 to 11_n may include a memory device to store data. For example, each of the memory chips 11_1 to 11_n may include dynamic random access memory (DRAM). An example of the DRAM may be synchronous DRAM (SDRAM) that operates in synchronization with a system clock signal, but the inventive concept is not limited thereto and each of the memory chips 11_1 to 11_n may include resistive RAM (RRAM), phase RAM (PRAM), magnetic RAM (MRAM), or spin transfer torque MRAM (STT-MRAM). A case where each of the memory chips 11_1 to 11_n includes SDRAM will now be described.

Figure 3A:
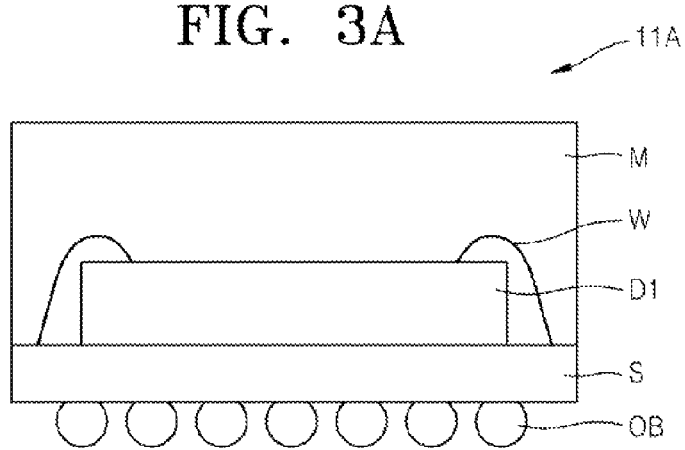
FIGS. 3 to 5 are side cross-sectional views illustrating package types of memory chips of the memory module of FIG. 1, according to exemplary embodiments of the inventive concept.
Figure 3B:
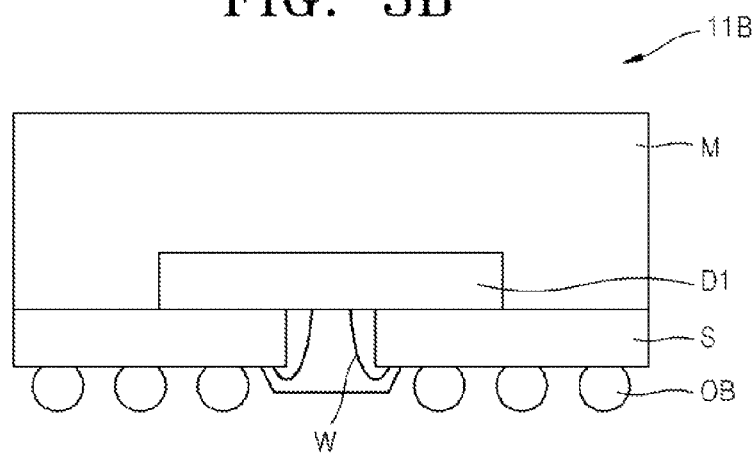
Figure 3C:
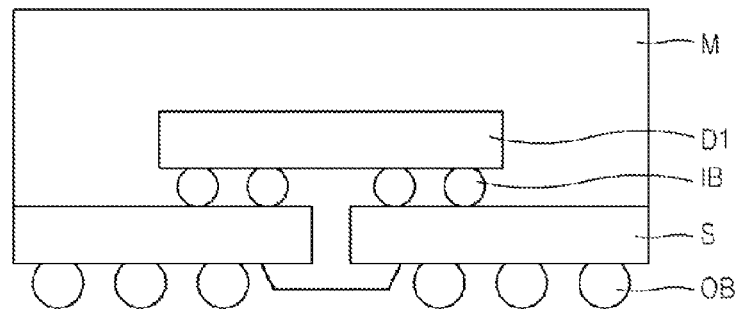

Each of the memory chips 11_1 to 11_n may include memory chips packaged using at least one semiconductor die, as will be described in detail with reference to FIGS. 3A to 3C below.

Referring to FIG. 1, the memory controller 20 may provide the memory module 10 with a command/address signal C/A, a control signal CTRL, and a clock signal CLK, via various buses. The memory controller 20 may control data DQ to be read from or to be written to the memory chips 11_1 to 11_n. The memory controller 20 may provide the command/address signal C/A, the control signal CTRL, e.g., a chip selection signal, a clock enable signal, and the like to the memory module 10. The memory controller 20 may also control exchange of the data DQ between memory chips to be accessed from among the memory chips 11_1 to 11_n in a write/read mode. The mode of the memory chips may be set according to the command/address signal C/A based on whether the control signal CTRL is activated. The memory controller 20 may control the amount of data to be simultaneously read from the memory chips 11_1 to 11_n during a read operation or may control the amount of data to be simultaneously written to the memory chips 11_1 to 11_n during a write operation. In this case, the number of memory chips from which data may be simultaneously read during the read operation or to which data may be simultaneously written during the write operation may be determined according to the structure of the memory chips 11_1 to 11_n and data widths of the buses. For example, if the memory chips 11_1 to 11_n are x8 structure and the data widths of the buses are 72 bits, then nine memory chips may be accessed from among the memory chips 11_1 to 11_n on the memory module 10 to perform reading/writing.

If the memory chips 11_1 to 11_n on the memory module 10 are double data rate (DDR) type SDRAMs, pseudo differential signaling may be generally used to exchange various signals between the memory chips 11_1 to 11_n.

A termination resistor (not shown) may be disposed at an end of each of various buses preventing signals exchanged between the memory controller 20 and the memory module 10 from being distorted due to impedance mismatching.

FIGS. 2A and 2B are side cross-sectional views illustrating examples of a bus structure of the memory module 10 of FIG. 1, according to an exemplary embodiment of the inventive concept.

Referring to FIGS. 1, 2A, and 2B, a module board of the memory module 10 may be embodied as a multilayer module board including a plurality of layers L1 to Lm. Here, 'm' denotes a positive integer. For convenience of explanation, the module board of the memory module 10 according to an exemplary embodiment is illustrated as a multilayer module board including four layers L1 to L4. The four memory chips 11_1 to 11_4 are illustrated as being disposed on the first layer L1, according to an uppermost layer of the module board. One bus is illustrated as being formed on the second layer L2 of the module board. However, the inventive concept is not limited thereto. A plurality of memory chips may be disposed on the fourth layer L4, which is a lowermost layer of the module board. A plurality of buses may be formed on different layers from among the four layers L1 to L4. One of the plurality of buses may be formed in a plurality of layers. The four layers L1 to L4 of the module board may be electrically disconnected via a prepreg layer (not shown). This bus may be one of a command/address signal bus, a control signal bus, or a clock signal bus.

A first node N1, a second node N2, and third nodes N3 of the bus may be disposed on the second layer L2 of the module board. The bus may vertically branch off from the first node N1, the second node N2, and the third nodes N3 to memory chips 11_1 to 11_4 corresponding to these nodes, and may thus provide a signal to the memory chips 11_1 to 11_4 via conductive members, e.g., conductive bumps, which are formed on a lower surface of the memory chips 11_1 to 11_4. Signal transmission paths from the first node N1, the second node N2, and the third nodes N3 to the memory chips 11_1 to 11_4 corresponding to these nodes may be embodied as through silicon vias (TSVs).

As illustrated in FIG. 2A, in the case of a bus disposed between the first node N1 and the second node N2 of the bus, a signal transmission path may horizontally extend between the first node N1 and the second node N2. Thus, a bus length θ1 between the first node N1 and the second node N2 of the bus may be longer than bus lengths θ2 between adjacent nodes from among the second node N2 to the third nodes N3. Accordingly, a distance between the memory chip 11_1 and the memory chip 11_2 may be greater than distances between the memory chips 11_2 to 11_4 that are the same.

Referring to FIG. 2B, in the case of a bus disposed between the first node N1 and the second node N2 of the bus, a signal transmission path may extend to a first layer L1 and a second layer L2 of a module board, between the first node N1 and the second node N2. Thus, a bus length θ1 between the first node N1 and the second node N2 of the bus may be longer than bus lengths θ2 between adjacent nodes from among the second node N2 to third nodes N3. In this case, distances between the memory chips 11_1 to 11_4 may be the same. In FIG. 2B, the signal transmission path extends to the first and second layers L1 and L2 of the module board, between the first node N1 and the second node N2 of the bus, but the inventive concept is not limited thereto. The signal transmission path between the first node N1 and the second node N2 of the bus may extend to three or more layers.

Figure 4A:
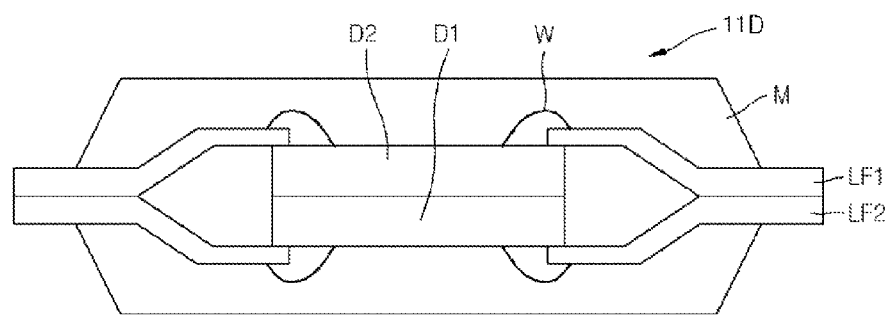
Figure 4B:
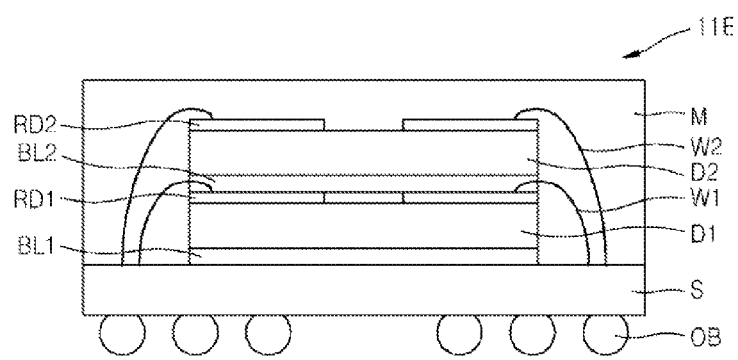
Figure 4C:
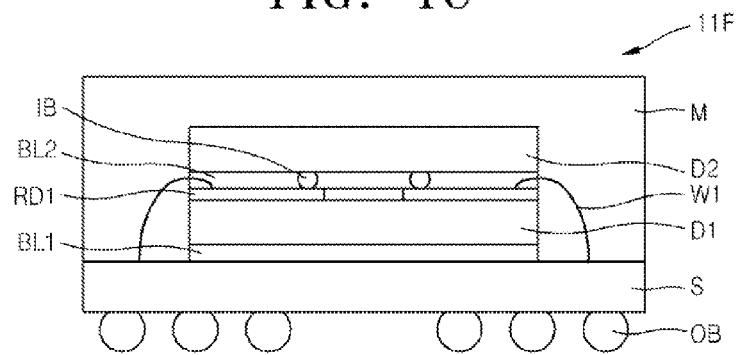
Figure 5:
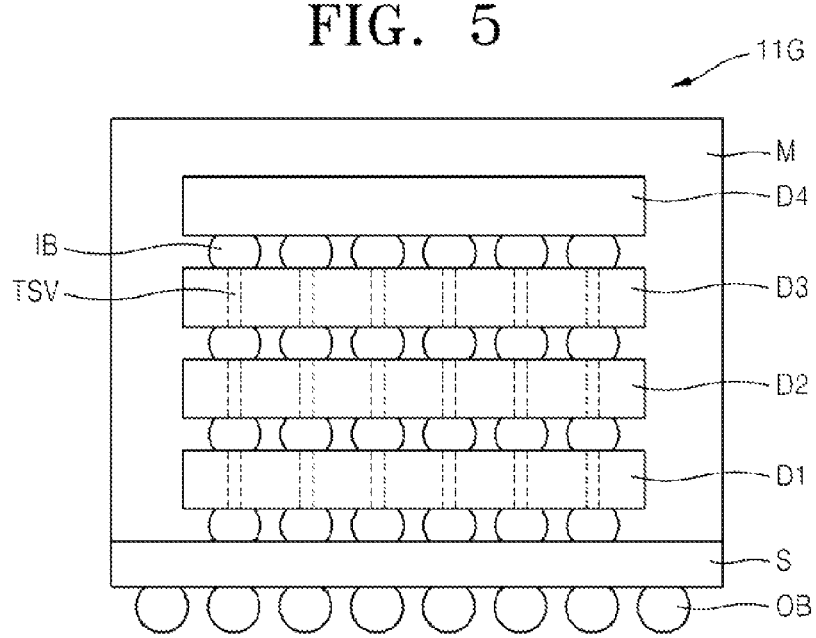

FIGS. 3 to 5 are side cross-sectional views illustrating package types of memory chips of the memory module 10 of FIG. 1, according to exemplary embodiments of the inventive concept. For convenience of explanation, each of semiconductor dies will be hereinafter described as an individual memory device, for example, DRAM or MRAM, but is not limited thereto and may be a combination of individual memory devices. The package types of memory chips illustrated in FIGS. 3 to 5 are just illustrative examples, and the memory chips 11_1 to 11_n illustrated in FIG. 1 may be any of various package types.

Referring to FIGS. 1 and 3A to 3C, the memory chips 11_1 to 11_n of the memory module 10 may be packaged in one of mono die structures 11A, 11B, and 11C.

The mono die structure 11A may include a semiconductor die D1 mounted on a substrate S, bonding wires W that electrically connect the substrate S and the semiconductor die D1, and a sealing member M that seals the semiconductor die D1 and the bonding wires W. In the mono die structure 11A, external connecting members OB, e.g., conductive bumps, may be formed on a lower surface of the substrate S, and the semiconductor die D1 may be electrically connected to buses formed on the module board via the external connecting members OB. Although not shown, an adhering member may be disposed between the semiconductor die D1 and the substrate S.

The mono die structure 11B may be similar to the mono die structure 11A, except that a central part of a substrate S may be open and a semiconductor die D1 and the substrate S may be electrically connected in the open part of the substrate S, via bonding wires W. For example, the mono die structure 11B may have a board on chip (BOC) structure.

The mono die structure 11C may be similar to the mono die structure 11B except that a semiconductor die D1 and a substrate S may be electrically connected via internal connecting members IB, e.g., conductive bumps.

Referring to FIGS. 1 and 4A to 4C, the memory chips 11_1 to 11_n of the memory module 10 may be packaged in one of dual die structures 11D, 11E, and 11F.

The dual die structure 11D may include an upper lead LF1 and a lower lead LF2 that are bonded with each other in such a manner that central parts thereof are respectively bent in opposite directions. Semiconductor dies D1 and D2 are disposed facing each other between the upper and lower leads LF1 and LF2. A sealing member M seals the semiconductor dies D1 and D2 and the upper and lower leads LF1 and LF2 to expose portions of the upper and lower leads LF1 and LF2 outside the sealing member M. The semiconductor dies D1 and D2 may be electrically connected to the upper lead LF1 and the lower lead LF2 via bonding wires W, respectively. In the dual die structure 11D, the semiconductor dies D1 and D2 may be electrically connected to buses formed on the module board via portions of the upper lead LF1 and the lower lead LF2 exposed outside the sealing member M.

The dual die structure 11E may include semiconductor dies D1 and D2 that are sequentially stacked on a substrate S, bonding wires W1 and W2 that are connected to redistribution layers RD1 on the semiconductor die D1 and redistribution layers RD2 on the semiconductor die D2 and a pad (not shown) of the substrate S and that electrically connect the semiconductor dies D1 and D2 to the substrate S, and a sealing member M that seals the semiconductor dies D1 and D2 and the bonding wires W1 and W2. An adhering member BL1 may be disposed between the semiconductor die D1 and the substrate S, and may be disposed between the semiconductor dies D1 and D2. Another adhering member BL2 may be disposed between the redistribution layers RD1 of the semiconductor die D1 and the semiconductor die D2. In the dual die structure 11E, external connecting members OB, e.g., conductive bumps, may be formed on a lower surface of the substrate S, and the semiconductor dies D1 and D2 may be electrically connected to the buses formed on the module board via the external connecting members OB.

The dual die structure 11F may be similar to the dual die structure 11E except that a semiconductor die D1 and a semiconductor die D2 may face each other and may have an adhering member BL2 therebetween. The semiconductor die D2 may be electrically connected to the semiconductor die D1 via internal connecting members IB connected to redistribution layers RD 1 on the semiconductor die D1. The semiconductor dies D1 and D2 may be electrically connected to the substrate S via bonding wires W connected to the redistribution layers RD 1 on the semiconductor die D 1 and the substrate S.

Referring to FIGS. 1 and 5, the memory chips 11_1 to 11_n of the memory module 10 may be packaged in a stacked die structure 11G using TSVs.

The stacked die structure 11G using TSVs may include a plurality of semiconductor dies D1 to D4 that are sequentially stacked on a substrate S, and a sealing member M that seals the semiconductor dies D1 to D4. In the stacked die structure 11G, the semiconductor dies D1 to D4 may be electrically connected via internal connecting members IB, e.g., conductive bumps and the TSVs. Although the semiconductor dies D1 to D4 according to an exemplary embodiment have been described as a stacked structure in which the semiconductor dies D1 to D4 are connected via the internal connecting members IB and the TSVs, the inventive concept is not limited thereto, and the semiconductor dies D1 to D4 may be a stacked structure in which the semiconductor dies D1 to D4 are connected via wire bonding, interposers, or tapes having wires.

Signals may be exchanged between the semiconductor dies D1 to D4 by using optical input/output (IO) connection. For example, the semiconductor dies D1 to D4 may be connected according to a radiative method using radio-frequency (RF) waves or ultrasonic waves, an inductive coupling method using magnetic induction, or a non-radiative method using magnetic field oscillation.

In the radiative method, signals are wirelessly transmitted via an antenna, e.g., a monopole antenna or a planar inverted-F antenna (PIFA). Radiation occurs when electric fields or magnetic fields that change according to time are influenced with each other. When antennas of the same frequency are used, signals may be received according to polarization characteristics of incident waves.

In the inductive coupling method, a strong magnetic field is generated in one direction by a coil wound with several turns, and coils that oscillate at similar frequencies are disposed adjacent to each other causing coupling to occur.

The non-radiative method is based on evanescent wave coupling that cause electromagnetic waves to move between two media that oscillate at the same frequency by using a near-field electromagnetic field.

In the stacked die structure 11G, external connecting members OB, e.g., conductive bumps, may be formed on a lower surface of the substrate S, and the semiconductor dies D1 to D4 may be electrically connected to the buses on the module board via the external connecting members OB.

Figure 6:
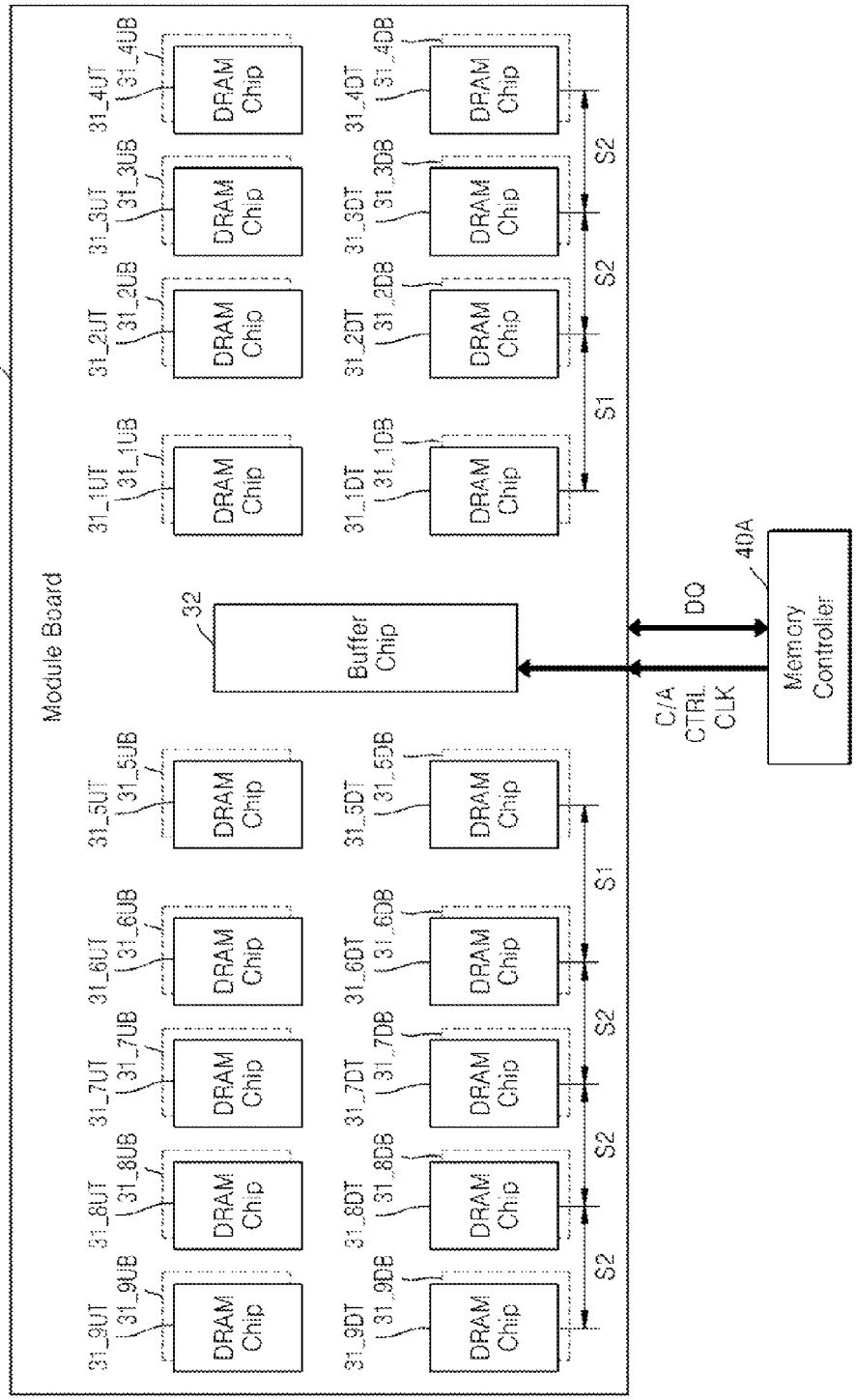
FIG. 6 is a detailed block diagram of an example of the memory module of FIG. 1, according to exemplary embodiments of the inventive concept.

FIG. 6 is a detailed block diagram of a memory module 30A that is an example of the memory module 10 of FIG. 1, e.g., a registered dual in-line memory module (RDIMM) according to an exemplary embodiment of the inventive concept. For convenience of explanation, a memory controller 40A that exchanges data with the memory module 30A and provides, e.g., a command/address signal, to the memory module 30A controlling the memory module 30A is also illustrated. The memory controller 40A is substantially the same as the memory controller 20 described above and will not be described again here.

Referring to FIG. 6, the memory module 30A may include a buffer chip 32, and a plurality of memory chips 31_1UT to 31_9UT, 31_1DT to 31_9DT, 31_1UB to 31_9UB, and 31_1DB to 31_9DB.

The buffer chip 32 may buffer the command/address signal C/A, a control signal CTRL, and a clock signal CLK received from the memory controller 40A, and transmit the command/address signal C/A, the control signal CTRL, and the clock signal CLK to the plurality of memory chips 31_1UT to 31_9UT, 31_1DT to 31_9DT, 31_1UB to 31_9UB, and 31_1DB to 31_9DB via a plurality of buses (not shown). In the buses, a bus length between a node corresponding to a first memory chip to which a signal output from the buffer chip 32 is transmitted and a node corresponding to a second memory chip may be longer than bus lengths between nodes corresponding to the other memory chips from among nodes that respectively branch off to these memory chips, as will be described below.

Although FIG. 6 illustrates that the clock signal CLK is provided from the memory controller 40A, the inventive concept is not limited thereto. The clock signal CLK may be provided from a clock generator (not shown) separated from the memory controller 40A. A phase locked loop circuit (not shown) may be connected between the clock generator and the buffer chip 32.

The plurality of memory chips 31_1UT to 31_9UT, 31_1DT to 31_9DT, 31_1UB to 31_9UB, and 31_1DB to 31_9DB may be SDRAMs that either output data to the memory controller 40A or receive data from the memory controller 40A and write the data thereto, in synchronization with a system clock signal. In particular, the plurality of memory chips 31_1UT to 31_9UT, 31_1DT to 31_9DT, 31_1UB to 31_9UB, and 31_1DB to 31_9DB may be DDR4 type SDRAMs.

The plurality of memory chips 31_1UT to 31_9UT, 31_1DT to 31_9DT, 31_1UB to 31_9UB, and 31_1DB to 31_9DB may be disposed on upper and lower surfaces of a module board to correspond to one another, and may be disposed in a first row and a second row at both sides of the buffer chip 32. For example, on the upper surface of the module board, the memory chips 31_1UT to 31_4UT and the memory chips 31_1DT to 31_4DT may be disposed in the first and second rows at one side of the buffer chip 32, and the memory chips 31_5UT to 31_9UT and the memory chips 31_5UT to 31_9UT may be disposed in the first and second rows at an opposite side of the buffer chip 32. On the lower surface of the module board, and the memory chips 31_1UB to 31_9UB and 31_1DB to 31_9DB may be disposed to correspond to the memory chips disposed on the upper surface of the module board.

In the plurality of memory chips 31_1UT to 31_9UT, 31_1DT to 31_9DT, 31_1UB to 31_9UB, and 31_1DB to 31_9DB, a distance S1 between a first memory chip and a second memory chip in each of the first and second rows with respect to the buffer chip 32 may be greater than distances S2 between the other memory chips, according to the above bus lengths. However, the inventive concept is not limited thereto, and distances between two adjacent memory chips from among the plurality of memory chips 31_1UT to 31_9UT, 31_1DT to 31_9DT, 31_1UB to 31_9UB, and 31_1DB to 31_9DB may be the same as described above (see FIGS. 2A and 2B).

Figure 7A:
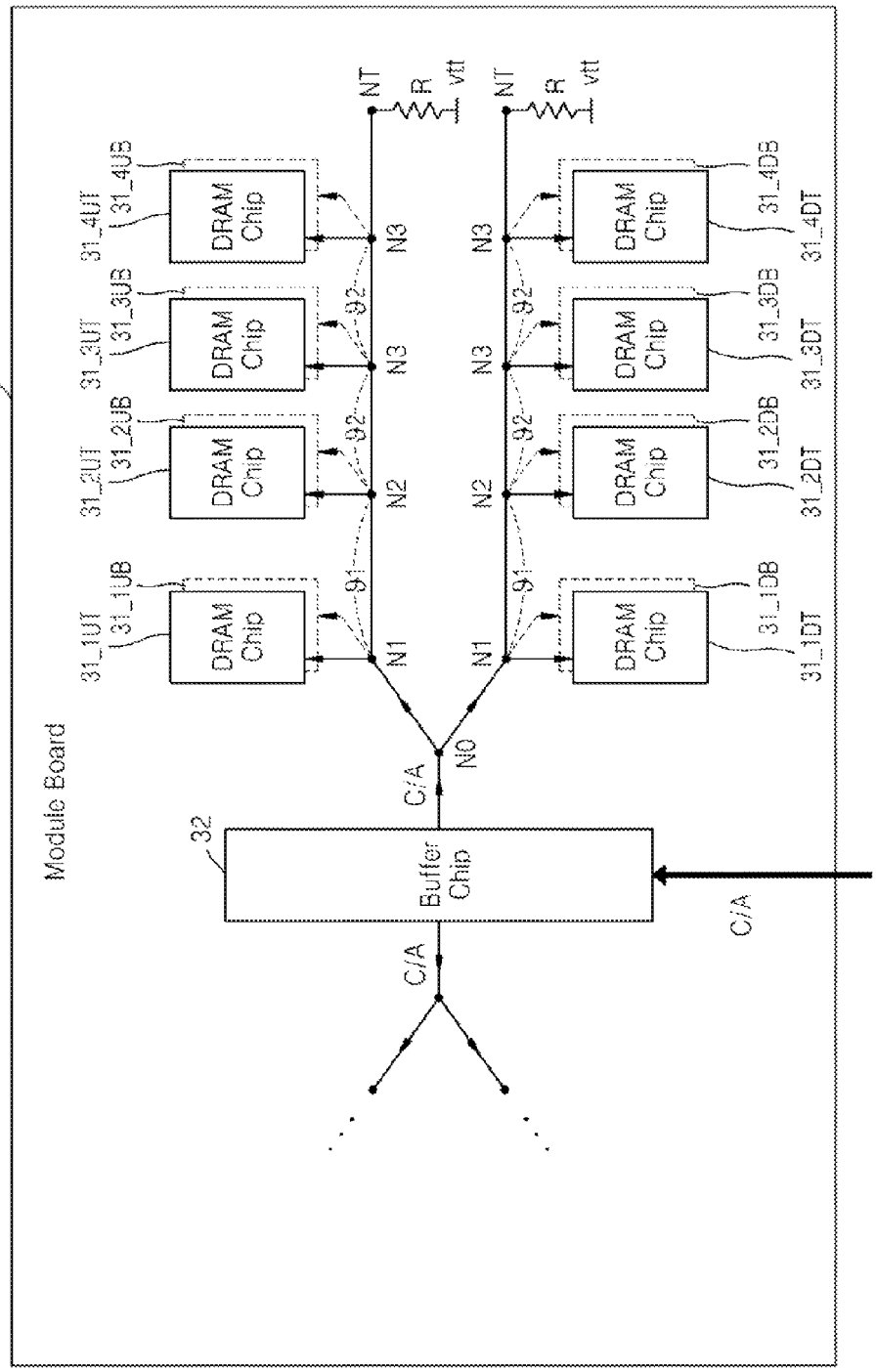
FIG. 7A illustrates a structure of a command/address signal bus of the memory module of FIG. 6, according to an exemplary embodiment of the inventive concept.
Figure 7B:
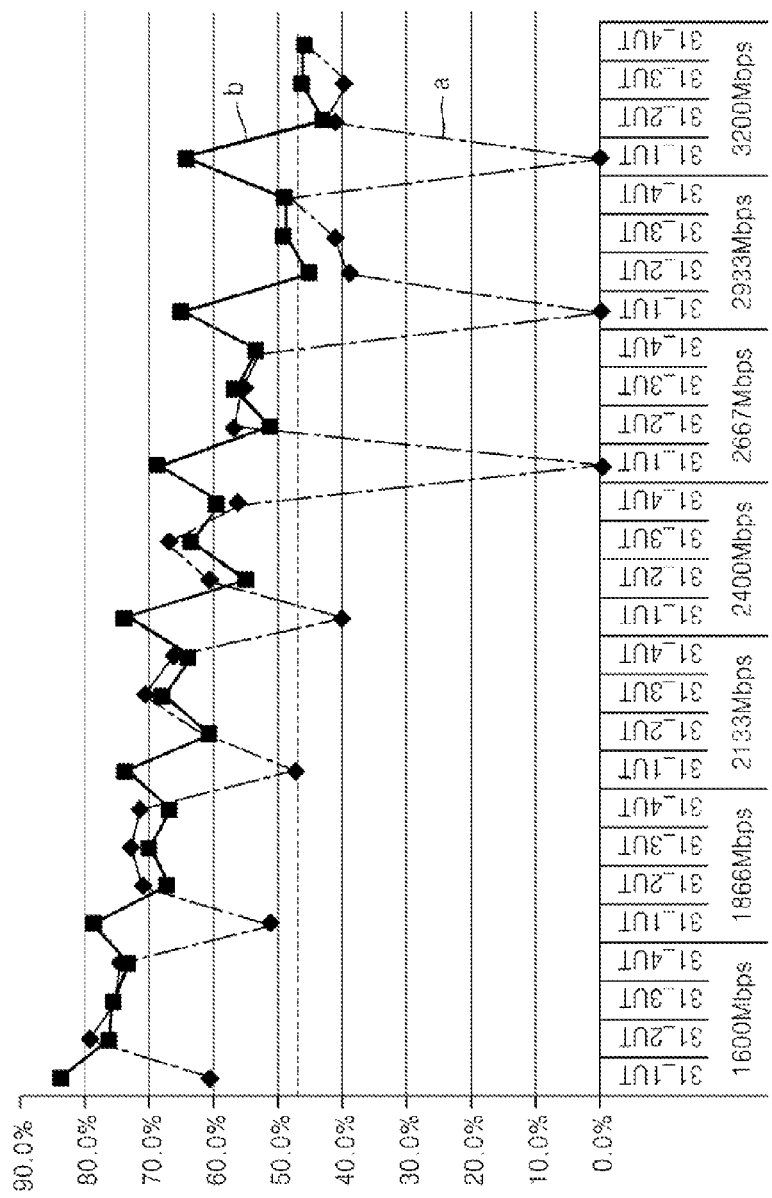
FIG. 7B is a graph showing signal characteristics according to the structure of the command/address signal bus of FIG. 7A according to an exemplary embodiment of the inventive concept.

FIG. 7A illustrates a structure of a command/address signal bus of the memory module 30A of FIG. 6 according to an exemplary embodiment of the inventive concept. FIG. 7B is a graph showing signal characteristics according to the structure of the command/address signal bus. Since the memory chips disposed at both sides of the buffer chip 32 have substantially the same structures and effects, only the memory chips on one side of the buffer chip 32 are illustrated in FIGS. 7A and 7B. This will also apply to FIGS. 8A and 8B and FIGS. 9A and 9B.

Referring to FIGS. 6 and 7A, the command/address signal bus of the memory module 30A may have a split fly-by structure. Specifically, in the command/address signal bus, nodes N1, N2, and N3 branch off in the first and second rows from a node N0, via which a command/address signal C/A output from the buffer chip 32 may be transmitted to the memory chips 31_1UT to 31_4UT and 31_1UB to 31_4UB in the first row, and the memory chips 31_DT to 31_4DT and 31_1DB to 31_4DB in the second row. The command/address signal bus may include termination resistors R connected to termination nodes NT in the first and second rows preventing the command/address signal C/A from being distorted due to impedance mismatching.

In the command/address signal bus, a bus length θ1 between the first node N1 and the second node N2 that branch off to the memory chips 31_1UT, 31_UB, 31_2UT, and 31_2UB in the first row may be longer than bus lengths between adjacent nodes from among the second node N2 and the third nodes N3 that branch off to the other memory chips in the first row.

In the command/address signal bus, a bus length θ1 between the first and second nodes N1 and N2 that branch off to the memory chips 31_1DT, 31_1DB, 31_2DT, and 31_2DB in the second row may be longer than bus lengths between adjacent nodes from among the second node N2 and the third nodes N3 that branch off to the other memory chips in the second row.

In the first and second rows, the bus lengths between adjacent nodes from among the second node N2 and the third nodes N3 that branch off to the other memory chips may be the same, e.g., θ2.

FIG. 7B is a graph showing a result of analyzing signal characteristics of the memory chips 31_1UT to 31_4UT according to operating speeds, when a command/address signal C/A is transmitted to the memory chips 31_1UT to 31_4UT disposed in the first row on the upper surface of the module board, via the command/address signal bus of FIG. 7A. Specifically, FIG. 7B illustrates a result of analyzing a degree of signal distortion by analyzing shapes of eye masks in the memory chips 31_1UT to 31_4UT.

In FIG. 7B, when a general command/address signal bus in which bus lengths between nodes that branch off to the memory chips 31_1UT to 31_4UT are the same (see graph a) is employed, the higher the operating speeds of the general command/address signal bus, the greater the degree of signal distortion in the memory chip 31_1 UT connected to the first node N1. This is because the intensity of noise generated due to reflection of a signal transmitted to or interference occurring in the memory chip 31_1UT at a front end of this bus is greater than in the other memory chips.

However, when according to an exemplary embodiment of the inventive concept, a bus length between the first node N1 and the second node N2 is longer than bus lengths between the second node N2 and the third node N3 as illustrated in FIG. 7A (see graph b), the degree of signal distortion in the memory chip 31_1UT connected to the first node N1 is reduced even if operating speeds are high. Accordingly, a sufficient ring back margin may be secured by increasing the bus length between the first node N1 and the second node N2, and a reflected wave and a transmitted wave generated in the command/address signal bus may thus be prevented from overlapping with each other, thereby greatly reducing the degree of signal distortion.

Figure 8A:
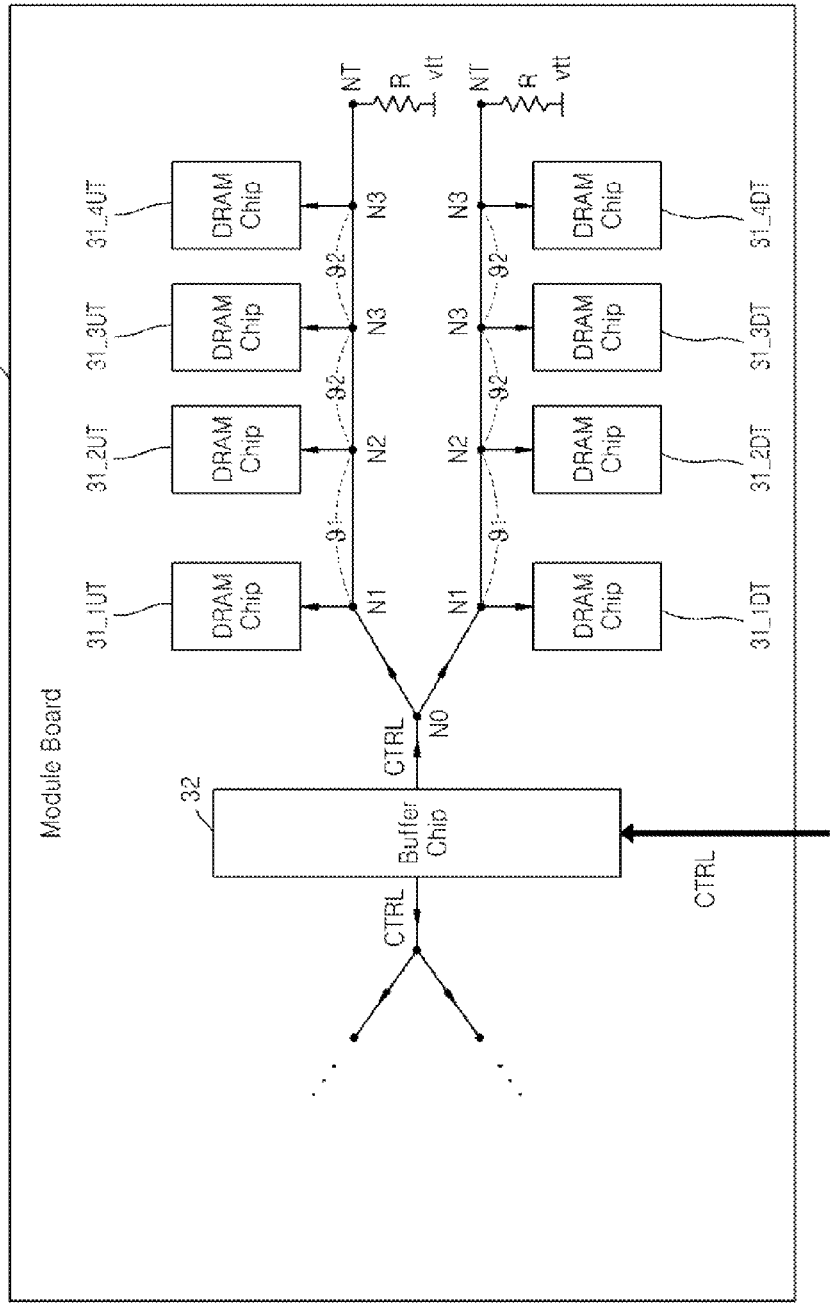
FIG. 8A illustrates a structure of a control signal bus of the memory module of FIG. 6, according to an exemplary embodiment of the inventive concept.
Figure 8B:
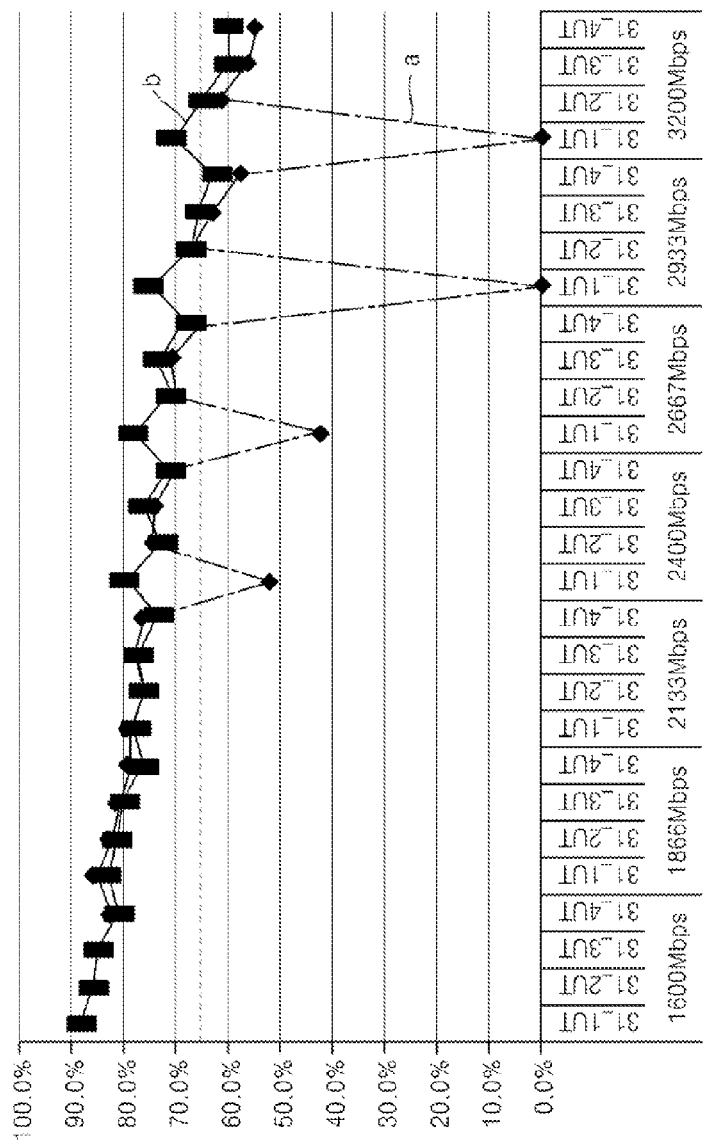
FIG. 8B is a graph showing signal characteristics according to the structure of the control signal bus of FIG. 8A.

FIG. 8A illustrates a structure of a control signal bus of the memory module of FIG. 6, according to an exemplary embodiment of the inventive concept. FIG. 8B is a graph showing signal characteristics according to the structure of the control signal bus of FIG. 8A.

Referring to FIGS. 6 and 8A, the control signal bus of the memory module 30A may have the split fly-by structure. The control signal bus may be connected to the memory chips disposed in the first and second rows on the upper and lower surfaces of the module board. Alternatively, the control signal bus may be connected to the memory chips disposed on only one of the upper and lower surfaces of the module board. In the memory module 30A including a plurality of memory chips, memory chips are simultaneously accessed in units of ranks when a read/write operation is performed, since a control signal CTRL, e.g., a chip selection signal, may be used to divide the memory chips in the units of ranks. According to an exemplary embodiment of the inventive concept, the control signal bus may be connected to the memory chips 31_1UT to 31_4UT and 31_1DT to 31_4DT disposed on the upper surface of the module board.

In the control signal bus, a first node N1, a second node N2, and third nodes N3 branch off in the first and second rows from a node N0, via which a control signal CTRL output from the buffer chip 32 may be transmitted to the memory chips 31_1UT to 31_4UT in the first row and the memory chips 31_1DT to 31_4DT in the second row. The control signal bus may further include termination resistors R at termination nodes NT in the first and second rows to prevent the control signal CTRL from being distorted due to impedance mismatching.

In the control signal bus, a bus length θ1 between the first node N1 and the second node N2 that respectively branch off to the memory chip 31_1UT and the memory chip 31_2UT in the first row, may be longer than bus lengths between adjacent buses from among the second node N2 and the third nodes N3 that branch off to the other memory chips in the first row.

In the control signal bus, a bus length θ1 between the first node N1 and the second node N2 that respectively branch off to the memory chip 31_1 DT and the memory chip 31_2DT in the second row may be longer than bus lengths between adjacent buses from among the second node N2 and the third nodes N3 that branch off to the other memory chips in the second row.

In the first and second rows, the bus lengths between adjacent buses from among the second node N2 and the third nodes N3 that branch off to the other memory chips may be the same, e.g., θ2.

FIG. 8B is a graph showing a result of analyzing signal characteristics of the memory chips 31_1UT to 31_4UT according to operating speeds, when a control signal CTRL is transmitted to the memory chips 31_1UT to 31_4UT disposed in the first row on the upper surface of the module board, via the control signal bus of FIG. 8A. Referring to FIG. 8B, as described above with reference to FIG. 7B, when a bus length between the first node N1 and the second node N2 of the control signal bus is longer than bus lengths between the second node N2 and the third node N3 (see graph b), the degree of signal distortion in the memory chip 31_1UT connected to the first node N1 is reduced even if operating speeds are high.

Figure 9A:
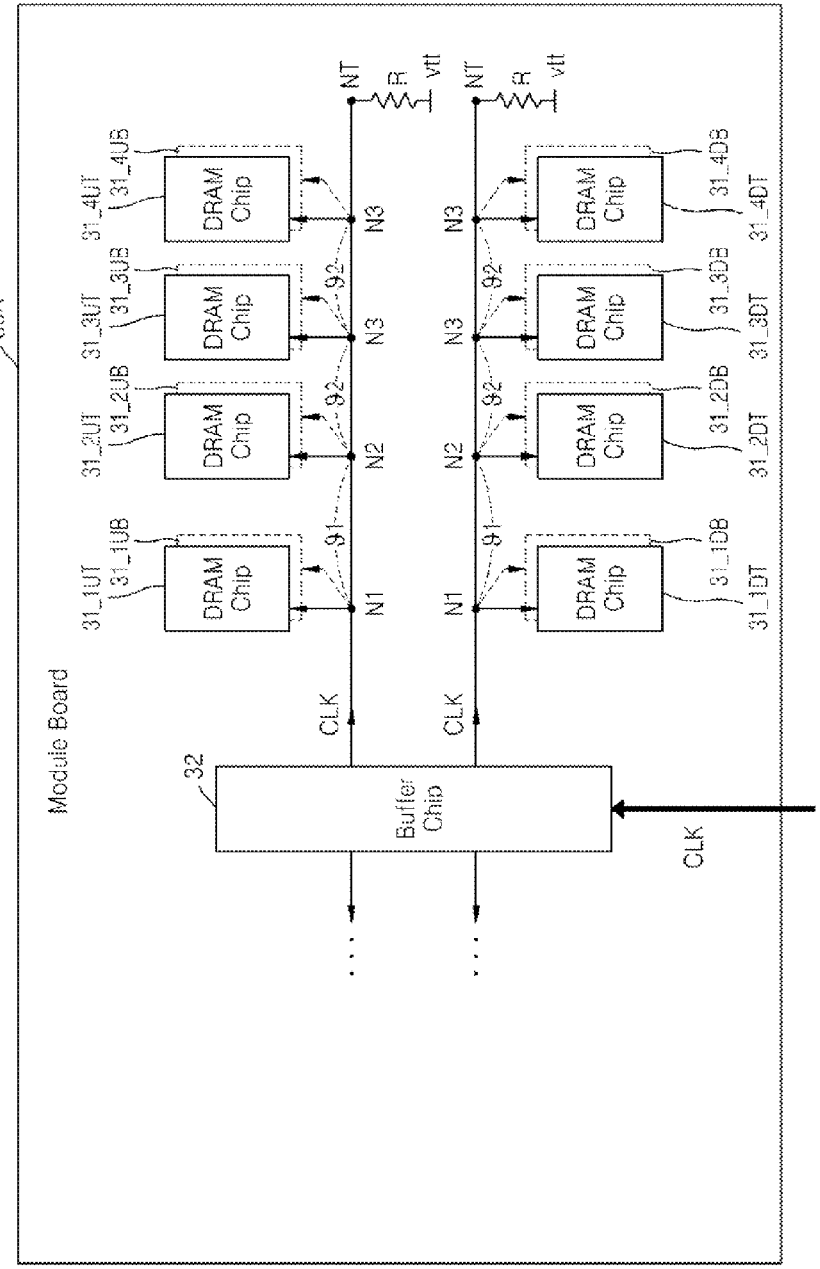
FIG. 9A illustrates a structure of a clock signal bus of the memory module of FIG. 6, according to an exemplary embodiment of the inventive concept.
Figure 9B:
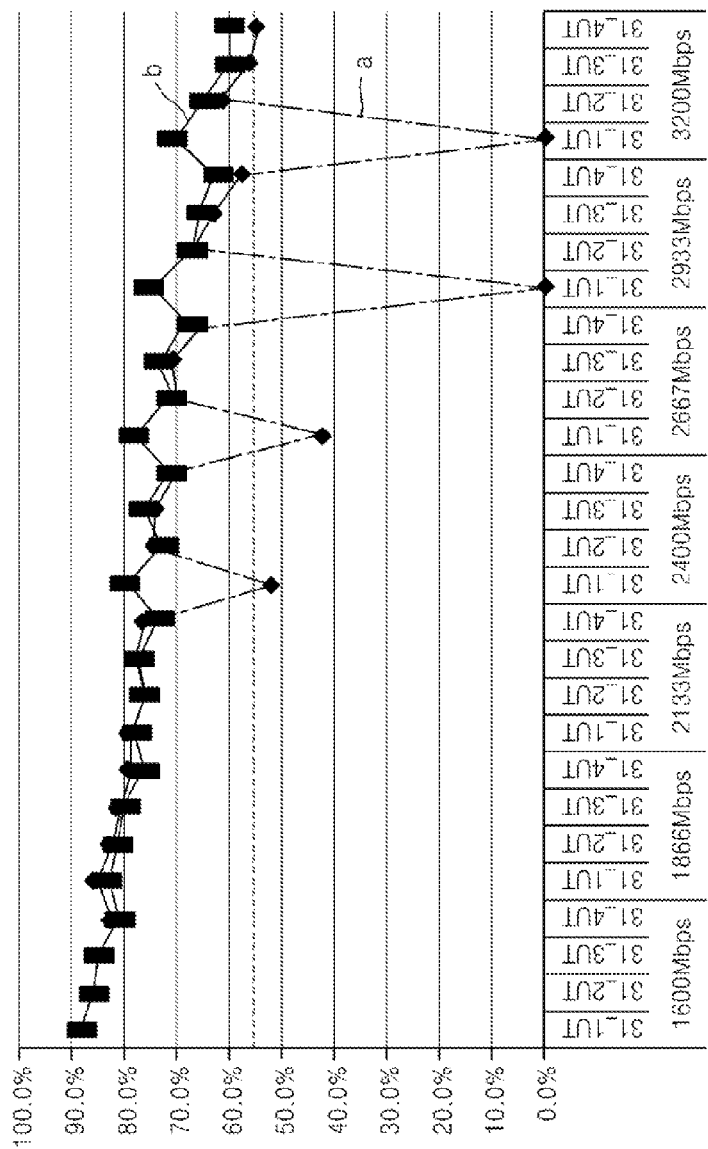
FIG. 9B is a graph showing signal characteristics according to the structure of the clock signal bus of FIG. 9A.

FIG. 9A illustrates a structure of a clock signal bus of the memory module 30A of FIG. 6, according to an exemplary embodiment of the inventive concept. FIG. 9B is a graph showing signal characteristics according to the structure of the clock signal bus of FIG. 9A.

Referring to FIGS. 6 and 9A, the clock signal bus of the memory module 30A may have a fly-by structure. For example, the clock signal bus may transmit a clock signal CLK received from the buffer chip 32 to the memory chips 31_1UT to 31_4UT and 31_1UB to 31_4UB in the first row and the memory chips 31_1DT to 31_4DT and 31_1DB to 31_4DB in the second row. The clock signal bus may include termination resistors R at termination nodes NT in the first and second rows preventing the clock signal CLK from being distorted due to impedance mismatching.

In the clock signal bus, a bus length θ1 between the first and second nodes N1 and N2 that branch off to the memory chips 31_1UT, 31_1UB, 31_2UT, and 31_2UB in the first row may be longer than bus lengths between adjacent nodes from among the second node N2 and the third nodes N3 that branch off to the other memory chips.

In the clock signal bus, a bus length θ1 between the first and second nodes N1 and N2 that branch off to the memory chips 31_1DT, 31_1DB, 31_2DT, and 31_2DB in the second row may be longer than bus lengths between adjacent nodes from among the second node N2 and the third nodes N3 that branch off to the other memory chips.

In the first and second rows, the bus lengths between adjacent nodes from among the second node N2 and the third nodes N3 that branch off to the other memory chips may be the same, e.g., θ2.

FIG. 9B is a graph showing a result of analyzing signal characteristics of the memory chips 31_1UT to 31_4UT according to operating speeds, when the clock signal CKL is transmitted to the memory chips 31_1UT to 31_4UT disposed in the first row on the upper surface of the module board, via the clock signal bus of FIG. 9A. Referring to FIG. 9B, as described above with reference to FIGS. 7B and 8B, when a bus length between the first node N1 and the second node N2 of the clock signal bus is longer than bus lengths between the second node N2 and the third node N3 (see graph b), the degree of signal distortion in the memory chip 31_1UT connected to the first node N1 is reduced even if the operating speeds are high.

As described above, a memory module according to an exemplary embodiment of the inventive concept has a bus structure in which a bus length between adjacent nodes that branch off to a first memory chip and a second memory chip starting from a front end of each of buses is longer than bus lengths between nodes that branch off to the other memory chips. Thus, it is possible to prevent the degree of signal distortion in the first memory chip at the front end of each of the buses from increasing at high operating speeds, caused when bus lengths between nodes that branch off to memory chips are the same. Accordingly, a sufficient ring back margin may be secured when the memory module operates at a high operating frequency, thereby securing high signal integrity. Thus, the memory module may be prevented from malfunctioning at high operating speeds.

In particular, as an increasing need for high-speed data processing has triggered use of a data transmitting/receiving technology, e.g., DDR4, after DDR3, a bus length of a particular node of a bus may be simply adjusted in order to compensate for signal distortion without having to install additional devices, thereby maintaining the reliability of data and enabling high-speed operations. When the bus length is adjusted, an arrangement of the existing memory chips may be maintained or adjusted within a minimum range.

FIGS. 10 to 15 are block diagrams of various embodiments of the memory module 10 of FIG. 1, according to the inventive concept. Structures and operations of memory modules illustrated in FIGS. 10 to 15 that are the same as those of the memory modules according to the previous embodiments will not be described in detail here.

Figure 10:
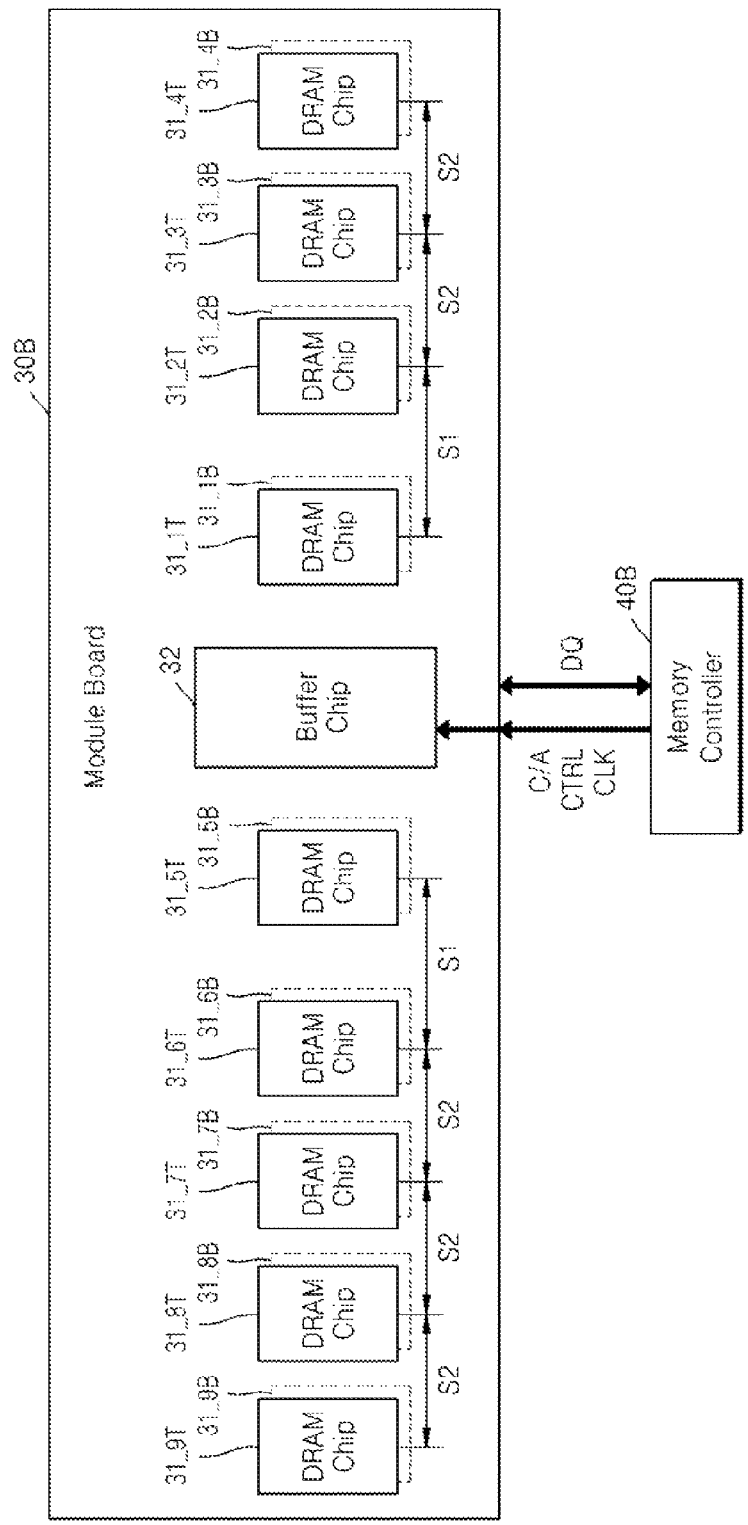
FIGS. 10 to 15 are block diagrams of various embodiments of the memory module of FIG. 1, according to exemplary embodiments of the inventive concept.

FIG. 10 is a schematic block diagram of a memory module 30B that is an example of the RDIMM of FIG. 6, according to an exemplary embodiment of the inventive concept. Referring to FIG. 10, the memory module 30B may include memory chips 31_1T to 31_9T and 31_1B to 31_9B. Unlike in FIG. 6, the memory chips 31_1T to 31_9T and the memory chips 31_1B to 31_9B are respectively disposed on an upper surface and a lower surface of a module board in a line at both sides of a buffer chip 32 so that the memory chips 31_1T to 31_9T and the memory chips 31_1B to 31_9B may respectively correspond to one another. The memory module 30B may include buses in the fly-by structure.

Figure 11:
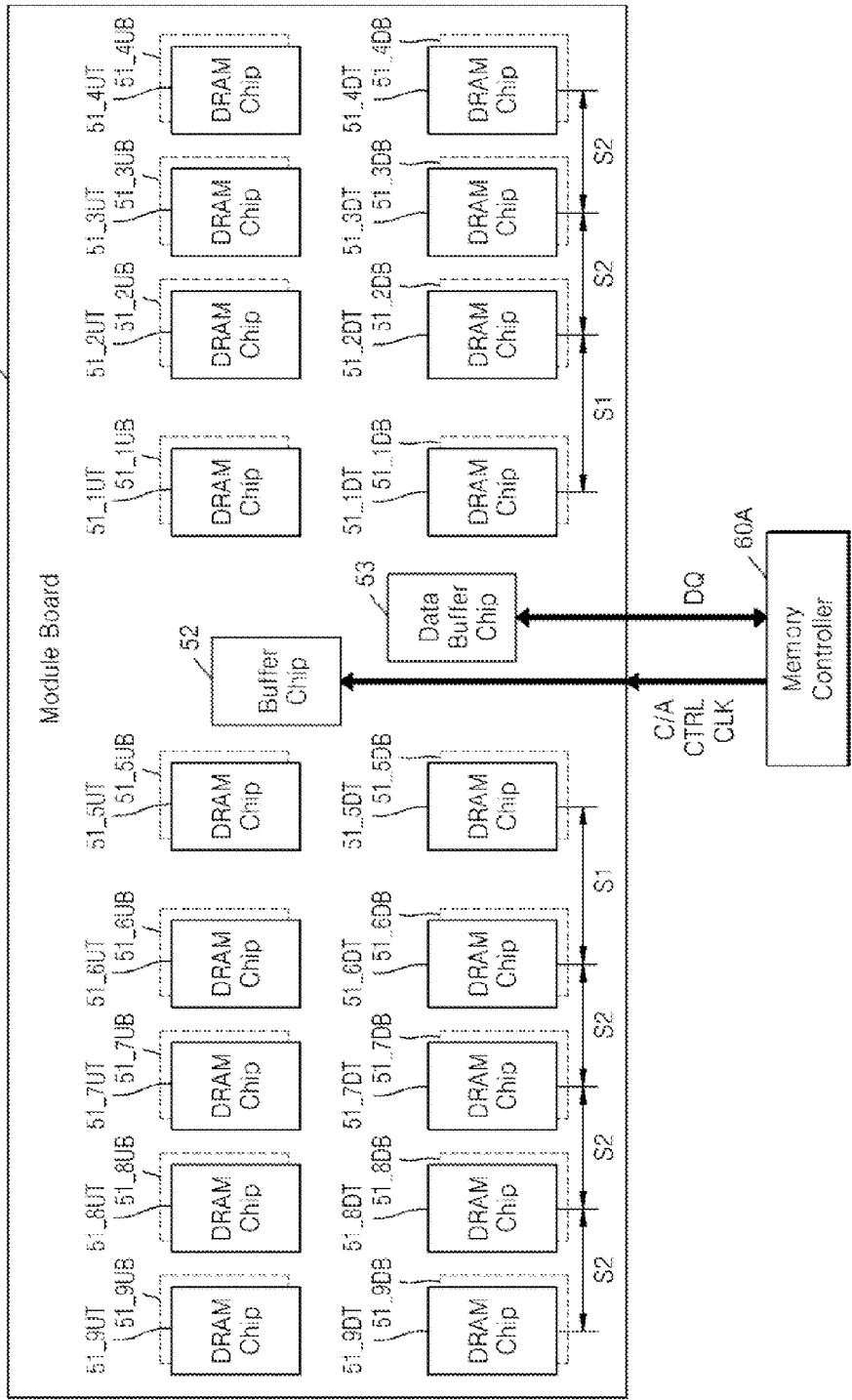

FIG. 11 is a schematic block diagram of a memory module 50A according to an example of a load reduced DIMM (LRDIMM), according to an exemplary embodiment of the inventive concept. Referring to FIG. 11, the memory module 50A may further include a data buffer chip 53 compared to the RDIMM of FIG. 6. The data buffer chip 53 may buffer data DQ received from a memory controller 60A and transmit the data DQ to a plurality of memory chips 51_1UT to 51_9UT, 51_1UB to 51_9UB, 51_1DT to 51_9DT, and 51_1DB to 51_9DB, or may buffer data DQ read from the memory chips 51_1UT to 51_9UT, 51_1UB to 51_9UB, 51_1DT to 51_9DT, and 51_1DB to 51_9DB and transmit the data DQ to the memory controller 60A. Although FIG. 11 illustrates that the data buffer chip 53 is included in the memory module 50A that is separated from a buffer chip 52, the data buffer chip 53 and the buffer chip 52 may be formed as one chip and included in the memory module 50A. Although FIG. 11 illustrates only one data buffer chip 53, the inventive concept is not limited thereto. A plurality of data buffer chips 53 corresponding to groups of memory chips may be included, for example, the number of the data buffer chips 53 may be equal to the number of memory groups, as will be described in detail with reference to FIG. 13 below.

Figure 12:
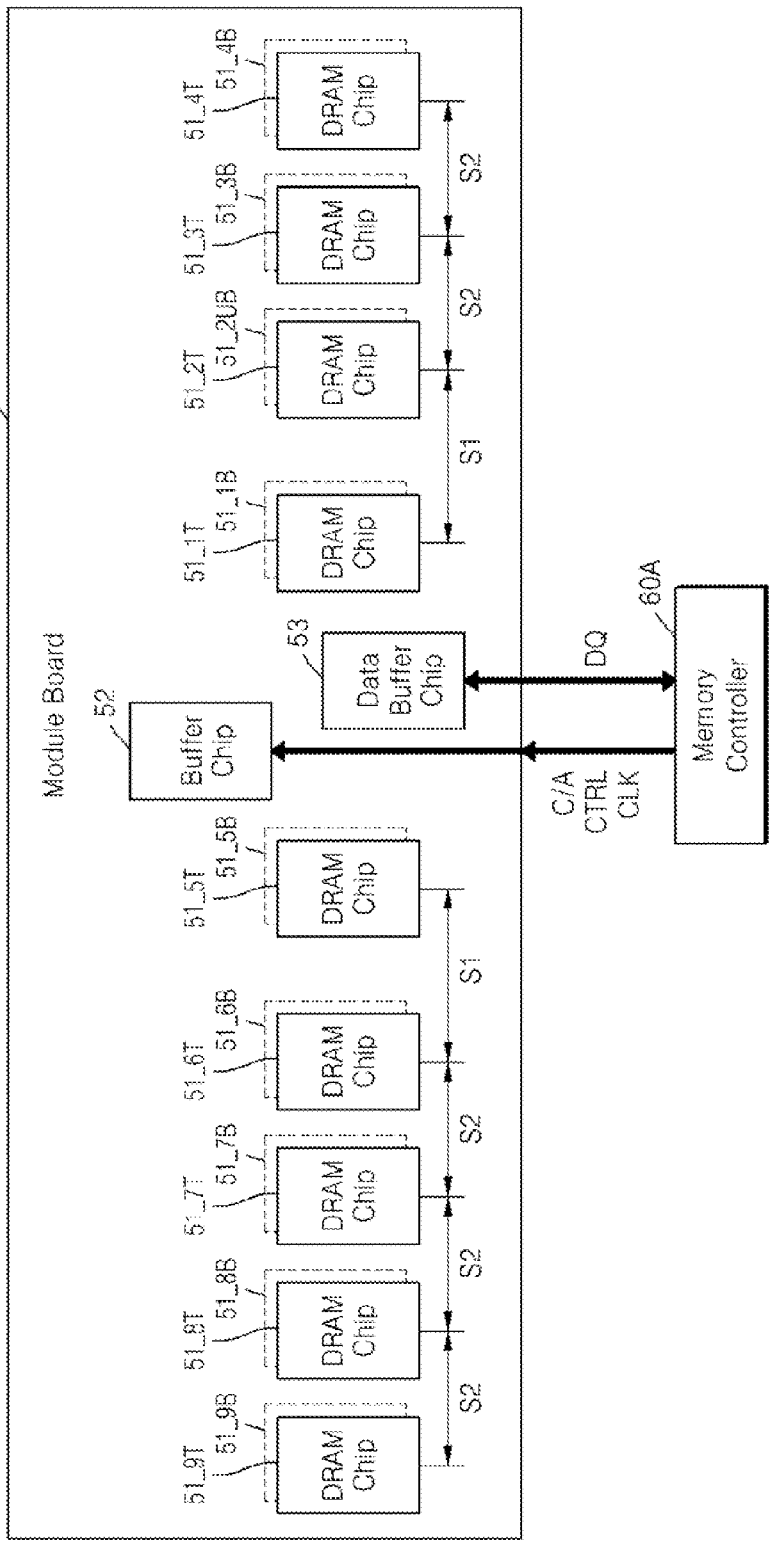

FIG. 12 is a schematic block diagram of a memory module 50A according to an example of the LRDIMM of FIG. 11. Referring to FIG. 12, the memory module 50A may include memory chips 51_1T to 51_9T and 51_1B to 51_9B. Unlike in FIG. 11, the memory chips 51_1T to 51_9T and the memory chips 51_1B to 51_9B may be respectively disposed on an upper surface and a lower surface of a module board in a line at both sides of each of a buffer chip 32 and a data buffer chip 53 so that the memory chips 51_1T to 51_9T and the memory chips 51_1B to 51_9B may correspond to each other. The memory module 50A may include buses in the fly-by structure.

Figure 13:
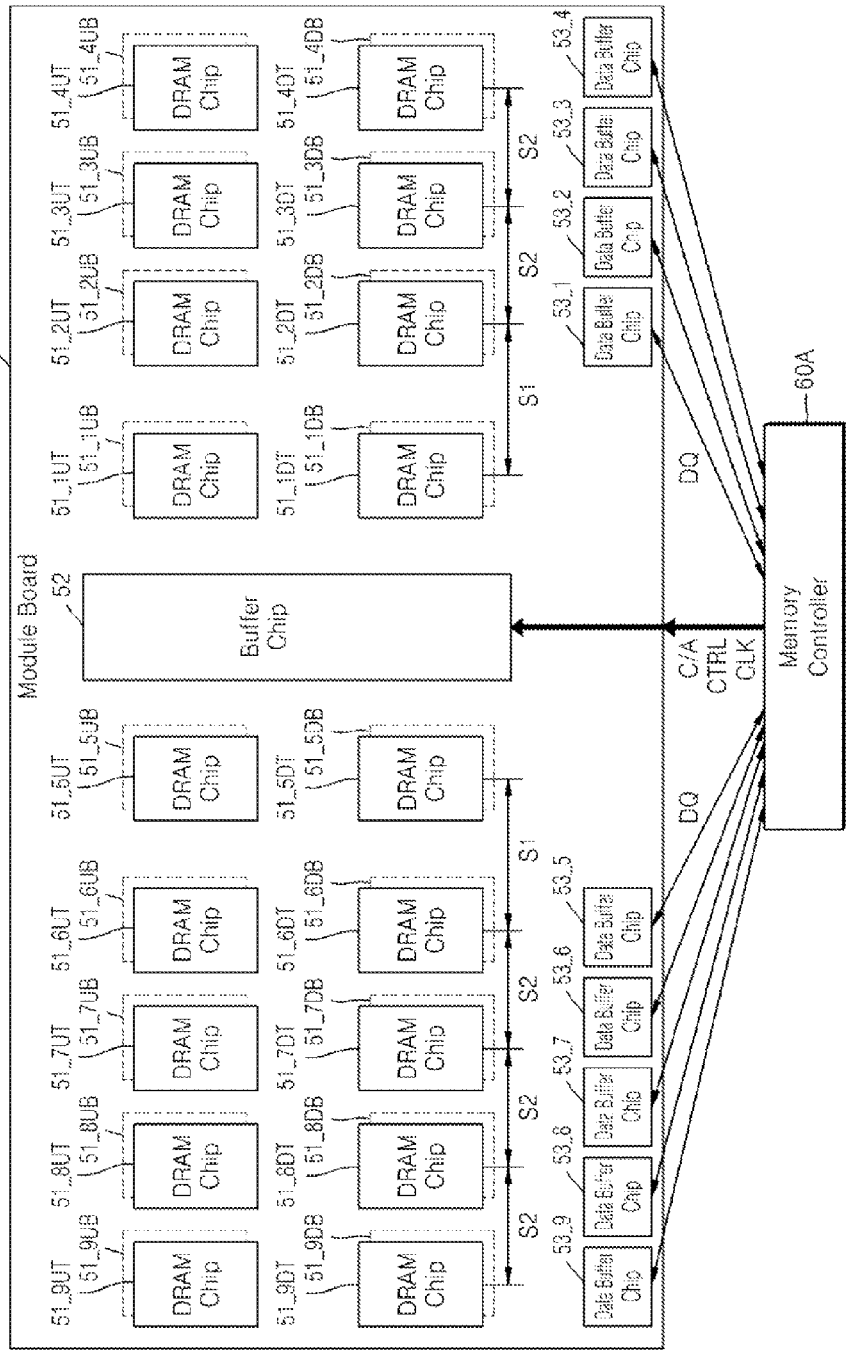

FIG. 13 is a schematic block diagram of a memory module 50A according to an example of the LRDIMM of FIG. 11. Referring to FIG. 13, the memory module 50A may include a plurality of data buffer chips 53_1 to 53_9. The data buffer chips 53_1 to 53_9 may buffer data DQ in units of groups of memory chips corresponding thereto. For example, the data buffer chip 53_1 may buffer data DQ received from a memory controller 60A and transmit the data DQ to memory chips 51_1UT, 51_1UB, 51_1DT, and 51_1DB, or may buffer data DQ read from the memory chips 51_1UT, 51_1UB, 51_1DT, and 51_1DB and transmit the data DQ to the memory controller 60A. This may apply to the other data buffer chips 53_2 to 53_9.

Figure 14:
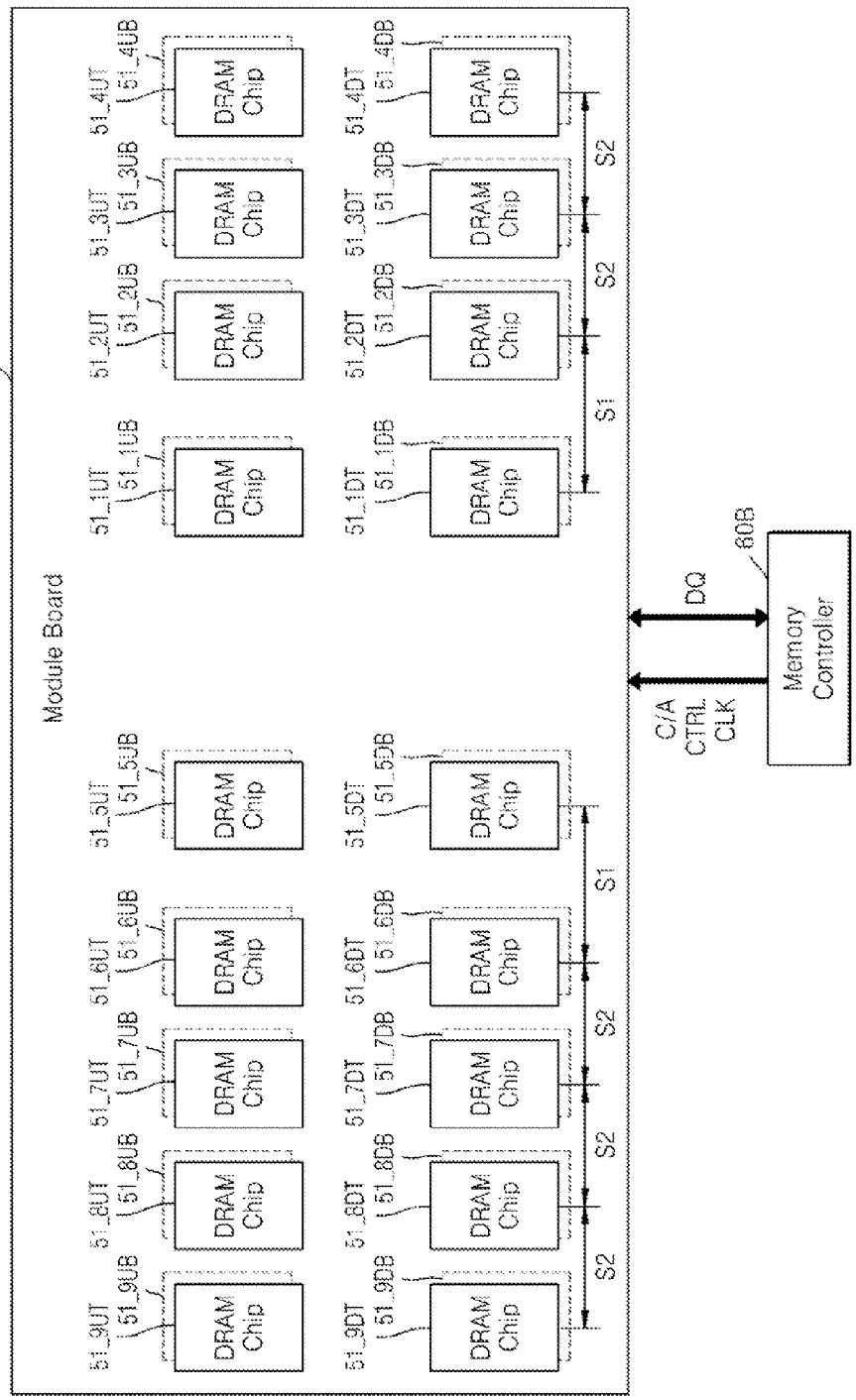

FIG. 14 is a schematic block diagram of a memory module 50B according to an example of an unbuffered DIMM (UDIMM), according to an exemplary embodiment of the inventive concept. Referring to FIG. 14, the memory module 50B may not include any buffer chip, unlike in the RDIMM of FIG. 6. For example, the memory module 50B may not buffer various signals received from a memory controller 60B, and may directly transmit the various signals to memory chips 51_1UT to 51_9UT, 51_1UB to 51_9UB, 51_1DT to 51_9DT, and 51_1DB to 51_9DB via various buses. If the buses are control signal buses, the memory module 50B may sequentially transmit a control signal CTRL to only memory chips disposed on one of an upper surface and a lower surface of a module board, via the control signal buses.

Figure 15:
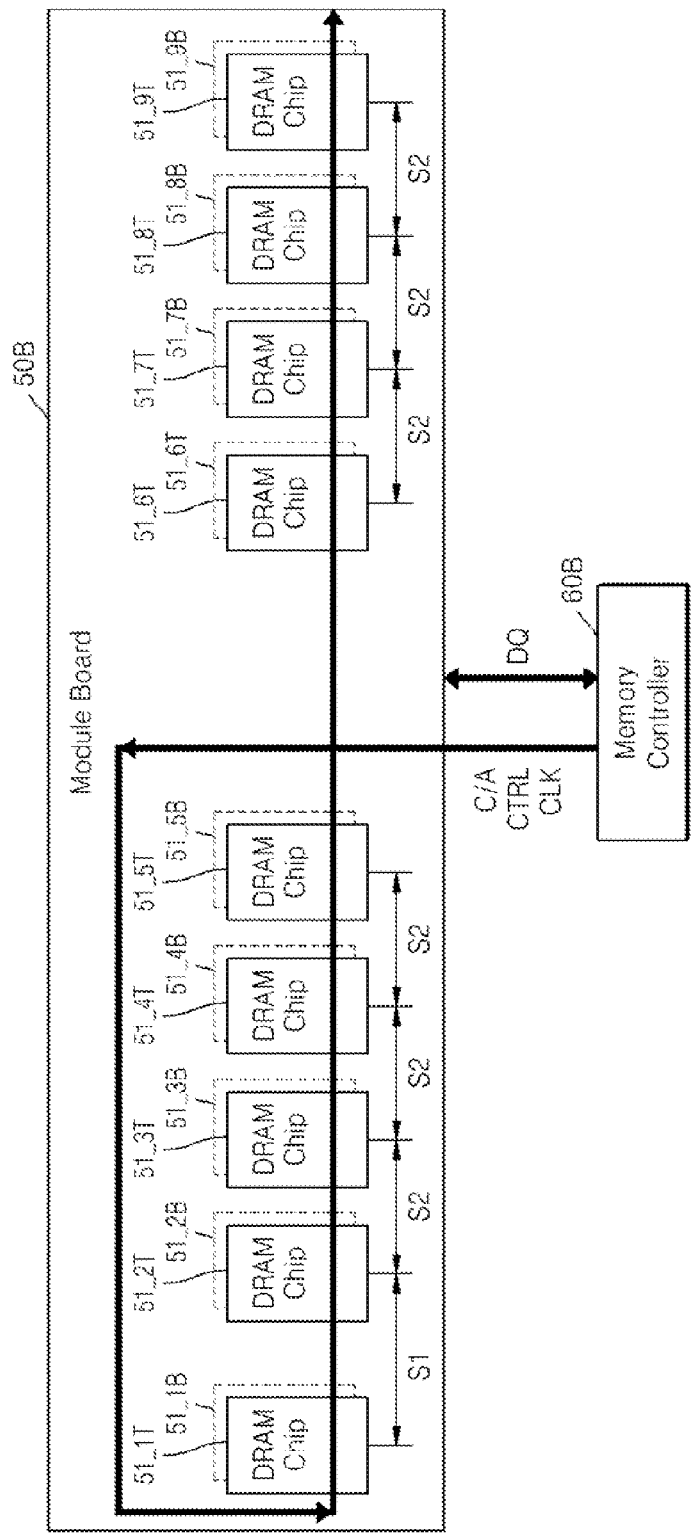

FIG. 15 is a schematic block diagram of a memory module 50B in accordance with an example of the UDIMM of FIG. 14. Referring to FIG. 15, the memory module 50B may include memory chips 51_1T to 51_9T and 51_1B to 51_9B disposed in a line. The memory module 50B may include buses in the fly-by structure, and various signals received from a memory controller 60B may be sequentially transmitted to the memory chips 51_1T to 51_9T and 51_1B to 51_9B via the buses. If the buses are control signal buses, the memory module 50B' may sequentially transmit a control signal CTRL to only memory chips on one of an upper surface and a lower surface of a module board via the control signal buses.

In the buses, a bus length between nodes that branch off to the memory chips 51_1T and 51_1B and a bus length between nodes that branch off to the memory chips 51_2T and 51_2B may be longer than bus lengths between adjacent nodes from among nodes that branch off to the other memory chip. A bus length between nodes that branch off to the memory chips 51_5T and 51_5B and a bus length between nodes that branch off to the memory chips 51_6T and 51_6B may be longer than the bus length between the nodes that branch off to the memory chips 51_1T and 51_1B and the bus length between the nodes that branch off to the memory chips 51_2T and 51_2B, according to an arrangement of the memory chips on the module board and an arrangement of wires of a data bus.

As described above, the inventive concept may be applied to various types of memory modules, e.g., RDIMM, LRDIMM, and UDIMM, and the memory modules 30B, 50A, and 50B of FIGS. 10 to 15 are capable of preventing the degree of signal distortion in a first memory chip at a front end of each of buses from increasing at high operating speeds. Thus, the memory modules 30B, 50A, and 50B of FIGS. 10 to 15 are capable of securing high signal integrity even when they operate at high operating frequencies and thus may perform high-speed operations while maintaining data reliability.

Figure 16:
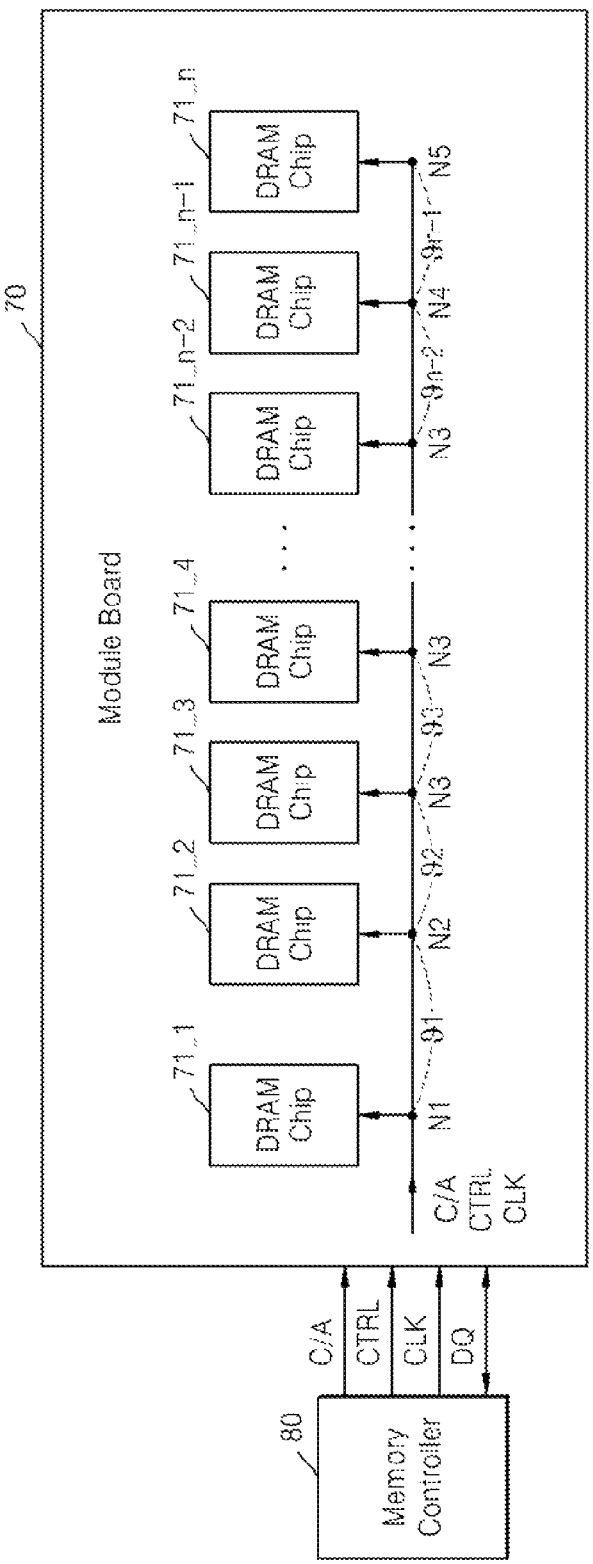
FIG. 16 is a block diagram a memory module according to an exemplary embodiment of the inventive concept.

FIG. 16 is a block diagram of a memory module 70 according to an exemplary embodiment of the inventive concept. For convenience of explanation, a memory controller 80 is also illustrated. The memory controller 80 is substantially the same as the memory controller 20 described above and will not be described in detail again here.

Referring to FIG. 16, the memory module 70 may include at least one memory chip. For example, the memory module 70 may include a plurality of memory chips disposed on an upper surface and/or a lower surface of a module board. According to an exemplary embodiment of the inventive concept, the memory module 70 may include a plurality of memory chips 71_1 to 71_n on the upper surface of the module board.

The memory chips 71_1 to 71_n may be disposed adjacent to one another along at least one bus. According to an exemplary embodiment of the inventive concept, the memory chips 71_1 to 71_n may be disposed adjacent to one another along a plurality of buses. For example, the memory chips 71_1 to 71_n may be disposed adjacent to one another along a command/address signal bus, a control signal bus, and a clock signal bus. For convenience of explanation, only one bus is illustrated in FIG. 16.

The memory chips 71_1 to 71_n may be connected to nodes of each of buses that branch off to the memory chips 71_1 to 71_n. For example, each of the memory chips 71_1 to 71_n may be connected to one of a first node N1, a second node N2, a plurality of third nodes N3, a fourth node N4, and a fifth node N5. In each of the buses, the first node N1 and the second node N2 may respectively branch off to the first and second memory chip 71_1 and 71_2 at a first end of the buses. The fourth node N4 and the fifth node N5 may respectively branch off to the first memory chip 71_n and the second memory chip 71_n−1 starting from a last end of each of the buses. The third nodes N3 may branch off to the memory chips 71_3 to 71_n−2 except for the first and second memory chips starting from the front and last ends of each of the buses. The memory chips 71_1 to 71_n may be arranged in a plurality of rows. In this case, the memory chips being respectively connected to the front end and the last end of each of the buses are arranged in the same row. The first node N1, the second node N2, the fourth node N4, and the fifth node N5 are disposed adjacent to locations on which each row switches to another row and may thus be arranged in the same row. A signal may first be transmitted to the memory chip 11_1 connected to the first node N1 and then be sequentially transmitted to the memory chips 71_2 to 71_n connected to the second node N2, the third nodes N3, the fourth node N4, and the fifth node N5, via the buses.

In each of the buses, a bus length θ1 between the first node N1 and the second node N2 of each of the buses and a bus length θ(n−1) between the fourth node N4 and the fifth node N5 may be longer than bus lengths θ2 to θ(n−2) between adjacent nodes from among the node N2 to the fourth node N4. The bus lengths θ2 to θ(n−2) between adjacent nodes from among the node N2 to the fourth node N4 may be substantially the same.

In the memory module 70, the distances between the memory chips 71_1 to 71_n are not determined according to the bus lengths between adjacent nodes. Thus, the distance between the first and second nodes N1 and N2 connected to the memory chips 71_1 and 71_2 and the distance between the fourth and fifth nodes N4 and N5 connected to the memory chips 71_n−1 and 71_n may be the same as those between adjacent nodes from among the other memory chips connected to the other nodes (see FIGS. 2A and 2B).

Each of the memory chips 71_1 to 71_n may include a memory device for storing data. Each of the memory chips 71_1 to 71_n may include a DRAM. An example of the DRAM may be SDRAM that operates in synchronization with a system clock signal. However, the inventive concept is not limited thereto and each of the memory chips 71_1 to 71_n may include an RRAM, a PRAM, an MRAM, or an STT-MRAM. A case where each of the memory chips 71_1 to 71_n includes SDRAM will now be described. Each of the memory chips 71_1 to 71_n may include memory chips packaged using at least one semiconductor die (see FIGS. 3 to 5).

A termination resistor (not shown) may be disposed at ends of each of various buses to prevent signals exchanged between the memory controller 80 and the memory module 70 from being distorted due to impedance mismatching.

Figure 17:
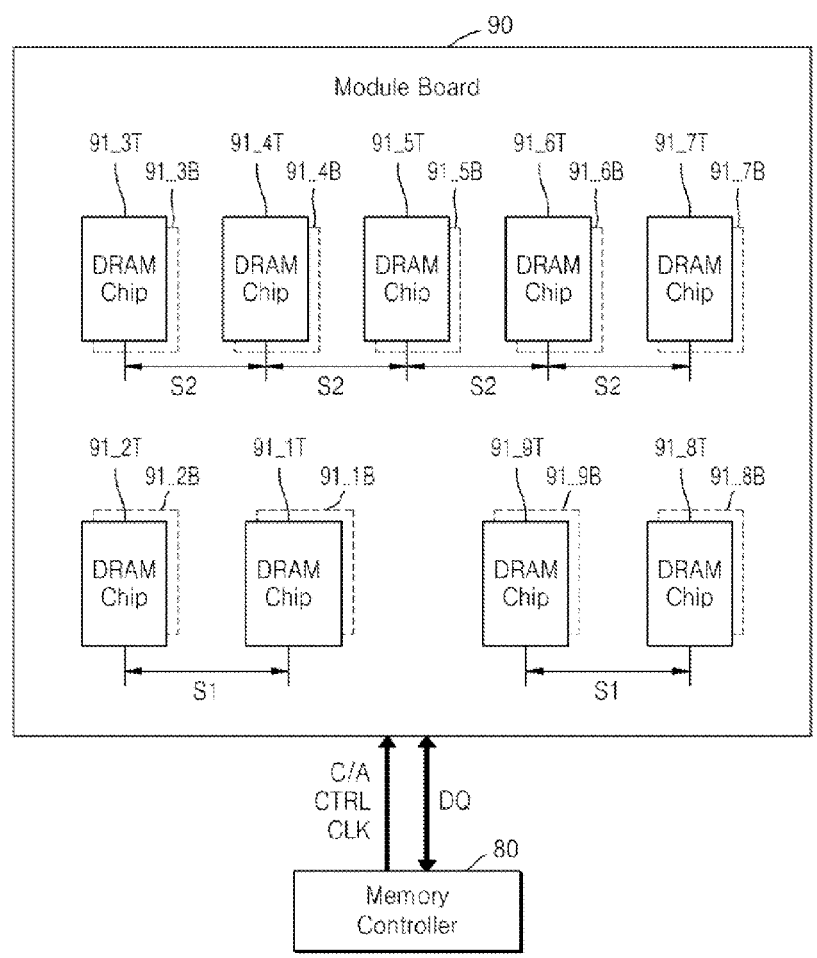
FIG. 17 is a schematic block diagram of an example of the memory module of FIG. 16.

FIG. 17 is a schematic block diagram of a memory module 90 that is an example of the memory module of FIG. 16, e.g., a small outline DIMM (SoDIMM). The SoDIMM is a type of the UDIMM, and does not buffer various signals received from a memory controller 80 and may be used in laptop computers and the like. For convenience of explanation, the memory controller 80 is also illustrated in FIG. 17.

Referring to FIG. 17, the memory module 90 may include a plurality of memory chips 91_1T to 91_9T and 91_1B to 91_9B. The memory chips 91_1T to 91_9T and 91_1B to 91_9B may receive a command/address signal C/A, a control signal CTRL, and a clock signal CLK from the memory controller 80 via a plurality of buses. In each of the buses, from among nodes that branch off to these memory chips, a bus length between a node corresponding to a first memory chip to which a signal transmitted from the memory controller 80 is first transmitted and a node corresponding to a second memory chip and a bus length between a node corresponding to a last memory chip to which the signal is last transmitted and a node corresponding to a memory chip right before the last memory chip may be longer than bus lengths between nodes corresponding to the other memory chips, as will be described below.

Each of the memory chips 91_1T to 91_9T and 91_1B to 91_9B may be an SDRAM that outputs data to the memory controller 80 or receives data from the memory controller 80 and writes the data thereto, in synchronization with a system clock signal. In particular, the memory chips 91_1T to 91_9T and 91_1B to 91_9B may be DDR4 type SDRAMs.

The memory chips 91_1T to 91_9T and the memory chips 91_1B to 91_9B may be respectively disposed on a upper surface and a lower surface of a module board in a first row and a second row in such a manner that the memory chips 91_1T to 91_9T and the memory chips 91_1B to 91_9B may correspond to each other. For example, on the upper surface of the module board, the memory chips 91_1T, 91_2T, 91_8T, and 91_9T may be disposed in the first row and the memory chips 91_3T to 91_7T may be disposed in the second row. On the lower surface of the module board, the memory chips 91_1B to 91_9B may be respectively disposed on locations corresponding to the memory chips disposed on the upper surface of the module board.

In the memory chips 91_1T to 91_9T and 91_1B to 91_9B, the distances S1 between the memory chips 91_1T and 91_2T, between the memory chips 91_1B and 91_2B, between the memory chips 91_8T and 91_9T, and between the memory chips 91_8B and 91_9B in the first row may be greater than the distances S2 between adjacent memory chips from among the memory chips memory chips 91_3T to 91_7T and 91_3B to 91_7B in the second row, according to the bus lengths as described. However, the inventive concept is not limited thereto, and the distances between adjacent memory chips from among the memory chips 91_1T to 91_9T and 91_1B to 91_9B in the first and second rows may be the same as described above (see FIGS. 2A and 2B). The distance between the first and second rows may be greater than those between adjacent memory chips in the first and second rows, according to an arrangement of the memory chips and a wire structure.

Figure 18A:
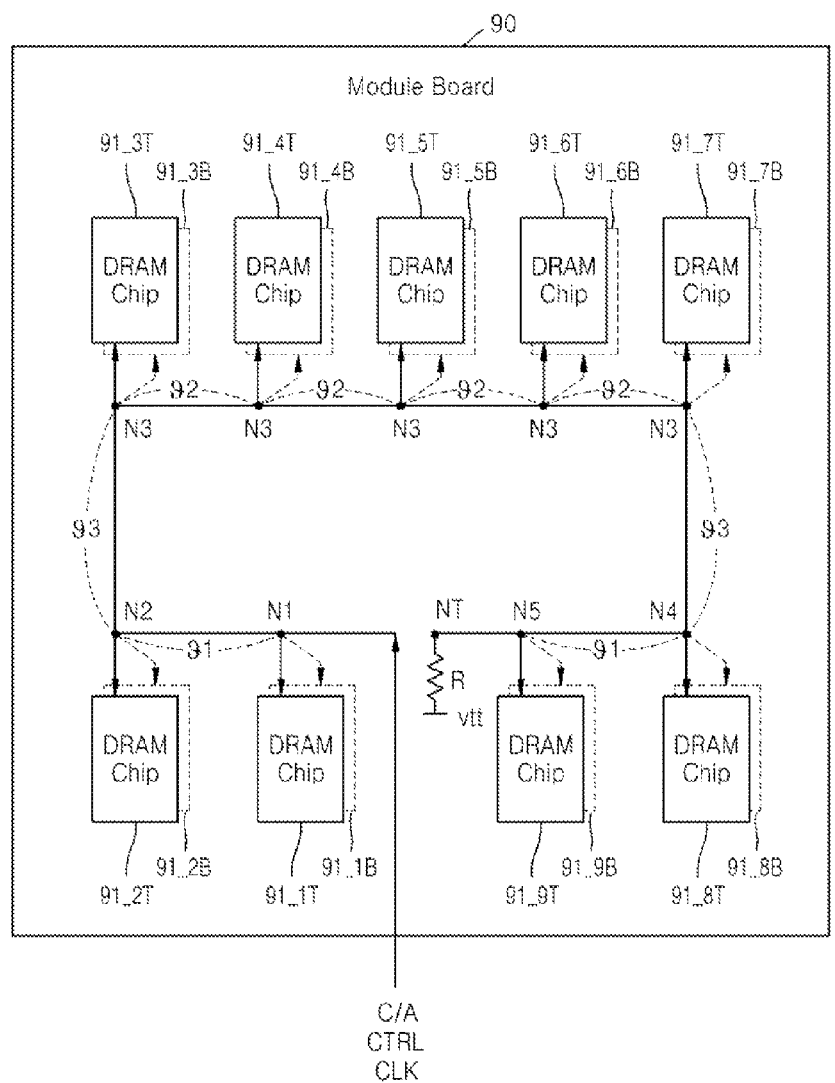
FIG. 18A illustrates a bus structure of the memory module of FIG. 17, according to an exemplary embodiment of the inventive concept.
Figure 18B:
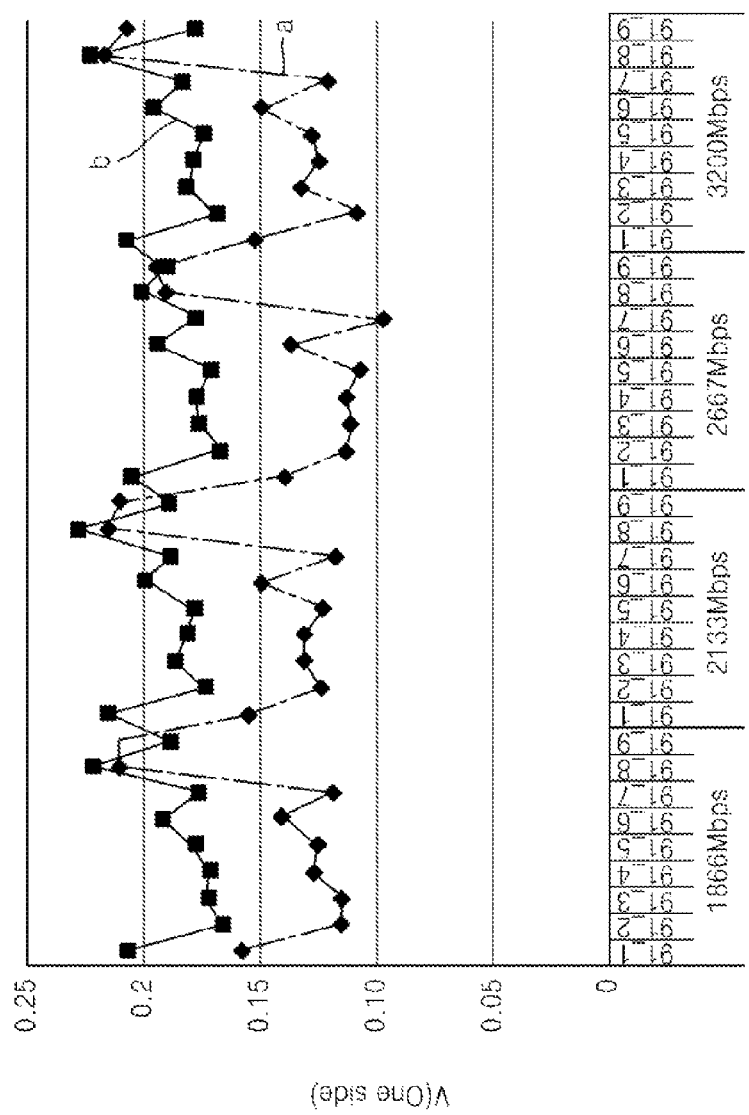
FIG. 18B is a graph showing ring back margin characteristics according to the bus structure of the memory module of FIG. 18A.

FIG. 18A illustrates a bus structure of a memory module 90, such as the memory module of FIG. 17, according to an exemplary embodiment of the inventive concept. FIG. 18B is a graph showing ring back margin characteristics according to the bus structure of the memory module of FIG. 18A. For convenience of explanation, only one bus is illustrated in FIG. 18A. The bus may be one of a command/address signal bus, a control signal bus, and a clock signal bus.

Referring to FIGS. 17 and 18A, the bus of the memory module 90 may have the fly-by structure. For example, a signal output from the memory controller 80 may be sequentially transmitted to the memory chips 91_1T, 91_1B, 91_2T, and 91_2B from among the memory chips in the first row, the memory chips 91_3T to 91_7T and 91_3B to 91_7B in the second row, and then to the memory chips 91_8T, 91_8B, 91_9T, and 91_9B in the first row, via the bus. The bus may include a termination resistor R at an end node Nt to prevent a signal transmitted via the bus from being distorted due to impedance mismatching.

In the bus, a bus length between a first node N1 that branches off to the memory chips 91_1T and 91_1B and a second node N2 that branches off to the memory chips 91_2T and 91_2B in the first row may be longer than bus lengths between third nodes N3 in the second row. A bus length between a fourth node N4 that branches off to the memory chips 91_8T and 91_9B and a fifth node N5 that branches off to the memory chips 91_9T and 91_9B in the first row may be longer than those between the third nodes N3. The bus length between the first node N1 and the second node N2 and the bus length between the fourth node N4 and the fifth node N5 may be the same, e.g., θ1. The bus lengths between the third nodes N3 may be the same, e.g., θ2.

Bus lengths θ3 between nodes disposed adjacent to locations on which the first row is switched to the second row or vice versa, i.e., the second node N2 and the first third node N3 and the last third node N3 and the fourth node N4, may be equal to or greater than the bus lengths θ1 between the first node N1 and the second node N2 and between the fourth node N4 and the fifth node N5.

FIG. 18B illustrates a result of analyzing signal characteristics of the memory chips 91_1T to 91_9T according to operating speeds when, for example, a command/address signal is transmitted to the memory chips 91_1T to 91_9T on an upper surface of a module board via the bus structure of FIG. 18A. Specifically, FIG. 18B illustrates a result of analyzing a ring back margin in each of the memory chips 91_1T to 91_9T.

Referring to FIG. 18B, when a general bus in which a bus length between nodes that branch off to the memory chips in the first row and a bus length between nodes that branch off to the memory chips in the second row are the same (see graph a), the difference between reference voltages of the memory chips in the first row and the memory chips in the second row is high and a ring back margin is thus not sufficient.

However, as illustrated in FIG. 18A, when according to an exemplary embodiment, the bus lengths between the first node N1 and the second node N2 and between the fourth node N4 and the fifth node N5 in the first row is longer than those between the other nodes (see graph b), the difference between reference voltages of the memory chips in the first row and the memory chips in the second row is not high not only at high speeds but even also at relatively low speeds and a ring back margin increases.

As described above, a memory module according to an exemplary embodiment of the inventive concept employs a bus in which bus lengths between nodes disposed adjacent to locations on which each row is switched to another row, e.g., the bus lengths between first and second nodes starting from a front end of the bus and between first and second nodes starting from a last end of the bus, are longer than those between the other nodes. Accordingly, a sufficient ring back margin may be secured and the degree of signal distortion may thus be prevented from increasing, thereby guaranteeing high signal integrity even at high operating speeds.

Figure 19:
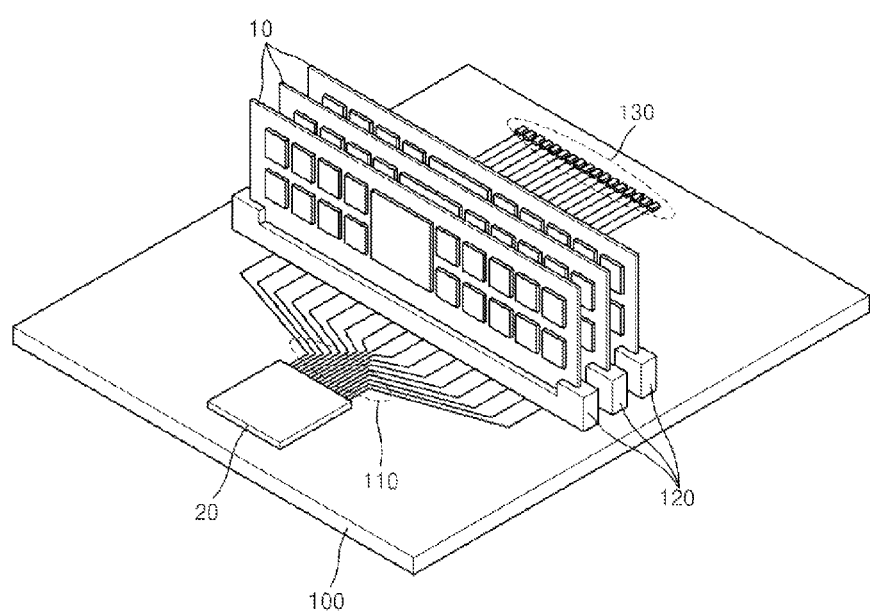
FIG. 19 illustrates a state in which memory modules are connected to a memory controller, according to an exemplary embodiment of the inventive concept.

FIG. 19 illustrates a state in which memory modules 10 are connected to a memory controller 20, according to an exemplary embodiment of the inventive concept. Referring to FIG. 19, a memory controller 20 and a plurality of connecting sockets 120 mounted on a main board 100 are electrically connected via a system bus 110. In each of the connecting sockets 120, a desired number of the memory modules 10 illustrated in FIG. 1 may be included. In each of the connecting sockets 120, the memory modules 30, 50, 70, and 90 according to the previous embodiments may further be included. Termination resistors 130 may be disposed on the main board 100 for impedance matching, like on the module boards in the previous embodiments.

Figure 20:
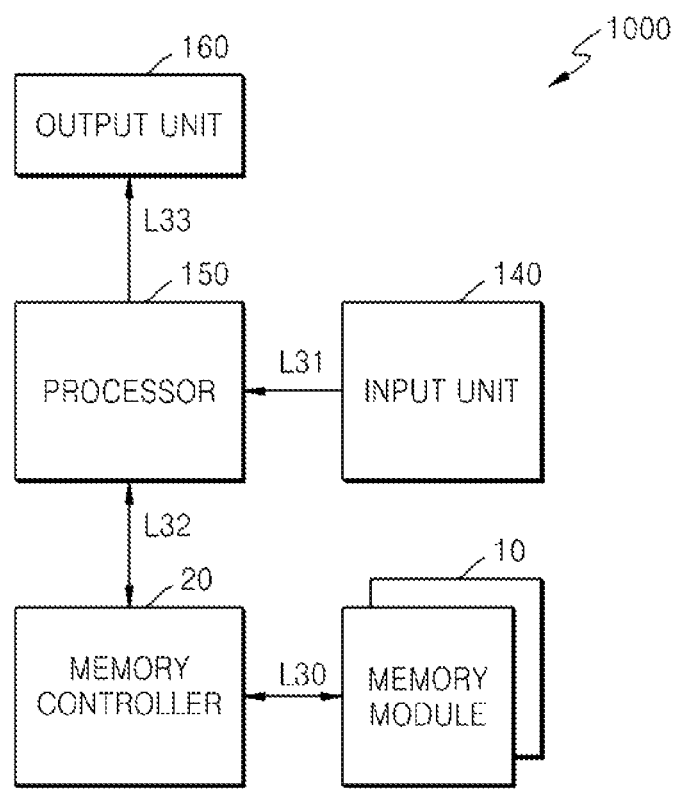
FIG. 20 is a block diagram of a data processing system employing a memory module, according to an exemplary embodiment of the inventive concept.

FIG. 20 is a block diagram of a data processing system 1000 employing a memory module 10, according to an exemplary embodiment of the inventive concept. Referring to FIG. 20, the data processing system 1000 includes the memory module 10 and a memory controller 20 as shown in FIG. 19, an input unit 140, a processor 150, and an output unit 160. If the data processing system 1000 is a personal computer (PC) or a laptop computer, the output unit 160 may be a VGA card 230-1 or a monitor 230-2 and the input unit 140 may be a keyboard 220 or a mouse 220 as illustrated in FIG. 21

Figure 21:
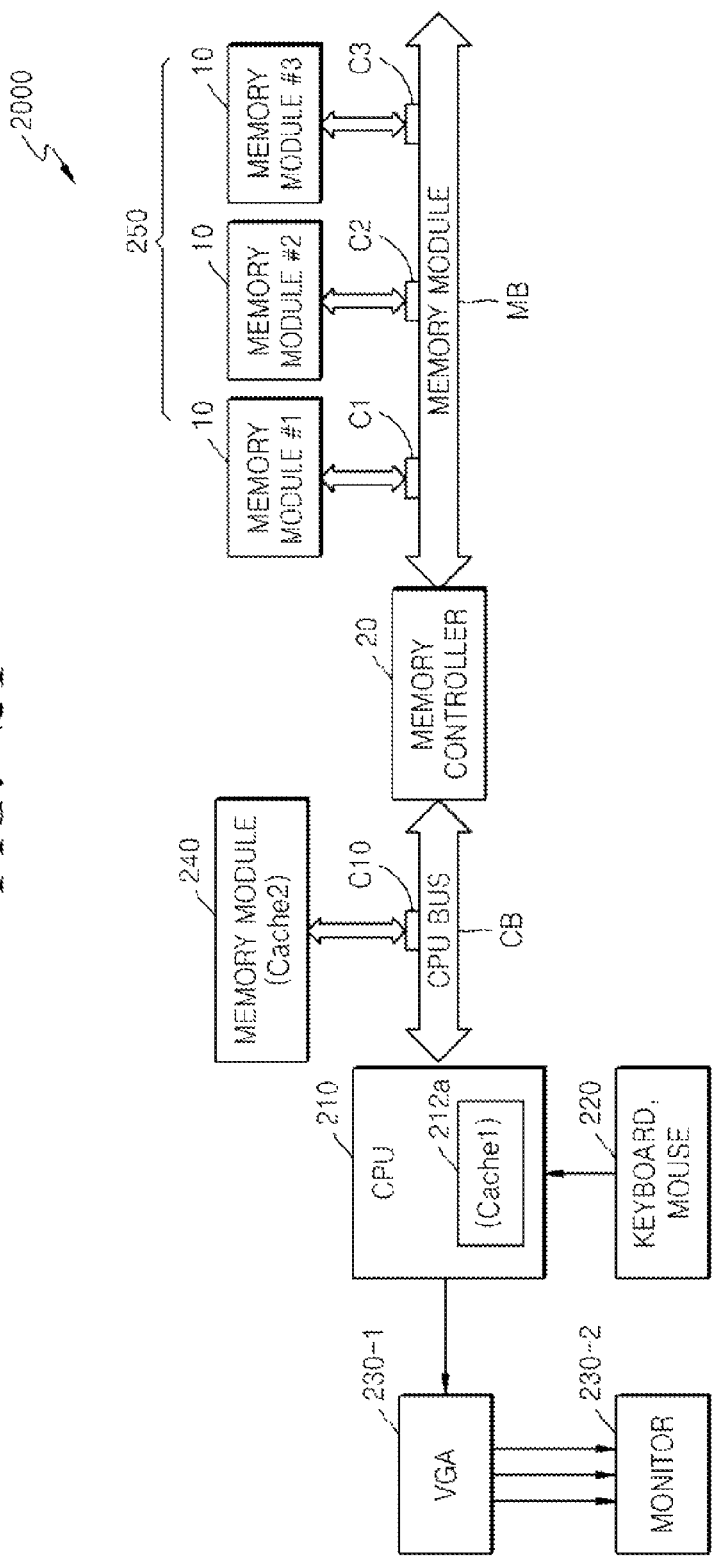
FIG. 21 is a detailed block diagram of a computer system to which the data processing system of FIG. 20 is applied, according to an exemplary embodiment of the inventive concept.

FIG. 21 is a detailed block diagram of a computer system 2000 to which the data processing system 1000 of FIG. 20 is applied, according to an exemplary embodiment of the inventive concept. In the computer system 2000 of FIG. 21, memory modules, such as that shown in the data processing system 1000, are used to increase the memory capacity of a level-2 (L2) cache include in a memory module 240 and increase the memory capacity of a main memory device 250.

Referring to FIG. 21, the computer system 2000 may include input/output (I/O) devices 220, 230-1, and 230-2, a central processing unit (CPU) 210, a CPU bus CB, a memory controller 20, a memory bus MB, and the main memory unit 250. The CPU 210 may include a level-1 (L1) cache 212a. The L1 cache 212a may be used to store data and/or commands that are frequently accessed. The CPU bus CB may include a connector socket C 10 via which the L2 cache included in the memory module 240 may be added. In an exemplary embodiment, the memory module 240 may be embodied as a memory module as described above with reference to FIG. 1 or 11. The memory module 240 may be inserted into the connector socket C10 to combine the connector socket C10 connected to the CPU bus CB with the L2 cache 240 in such a mariner that the connector socket C10 may correspond to a tab of the L2 cache 240. Thus, the memory module 240 may provide the L2 cache to the computer system 2000. The L2 cache included in the memory module 240 may also store data and/or commands that are frequently accessed, similar to the L1 cache 212a. In most cases, data and/or commands that are most frequently accessed may be stored in the L1 cache 212a.

A plurality of connector sockets C1, C2, and C3 may be connected to a memory bus MB increasing the memory capacity of the main memory 250 in the computer system 2000 of FIG. 21. When connecting terminals (tabs) formed on a plurality of memory modules 10 are inserted into the connector sockets C1, C2, and C3, the plurality of memory modules 10 are connected to the memory bus MB increasing the memory capacity of the main memory device 250.

Thus, as illustrated in FIG. 21, the plurality of memory modules 10 may be used to expand the main memory device 250 of the computer system 2000. When the memory modules according to the above embodiments are used, a sufficient ring back margin may be secured even at high operating frequencies and signal distortion may be prevented, thereby enabling high-speed operations.

In a data processing system according to an exemplary embodiment of the inventive concept, a number of processors may be expanded to two or more. Such processors may be, for example, microprocessors, CPUs, digital signal processors, microcontrollers, reduced command set computers, complex command set computers, or the like.

While the inventive concept has been particularly shown and described with reference to exemplary embodiments thereof, it will be understood that various changes in form and details may be made therein without departing from the present disclosure.

What is claimed is:

1. A memory module comprising:
a plurality of buses;
a plurality of memory chips mounted on a module board, and connected to a first node, a second node, and a plurality of third nodes of the plurality of buses, respectively; and
a buffer chip mounted on the module board,
wherein the first node, the second node, and the third nodes branch off to a first memory chip, a second memory chip, and a plurality of third memory chips, respectively,
wherein a length of the bus between the first node of the first memory chip, and the second nodes of the second memory chip is longer than a length of any other buses of the plurality of buses, and
wherein the first memory chip of the plurality of memory chips is closer to the buffer chip than any of the other memory chips of the plurality of memory chips.

2. The memory module of claim 1, wherein the lengths of the plurality of buses between adjacent nodes from among the second node and the third nodes are all equal.

3. The memory module of claim 1, wherein the buffer chip controls operations of the plurality of memory chips.

4. The memory module of claim 3, wherein the plurality of memory chips is disposed on an upper surface and a lower surface of the module board in at least one row at both sides of the buffer chip, in such a manner that the memory chips on the upper surface of the module board and the memory chips on the lower surface of the module board correspond to each other,
wherein the plurality of buses comprise a command/address signal bus having a split fly-by structure, and
wherein a command/address signal provided from the buffer chip is transmitted to the memory chips disposed on the upper and lower surfaces of the module board and connected to the first node, the second node, and the plurality of third nodes, via the command/address signal bus.

5. The memory module of claim 3, wherein the plurality of memory chips is disposed on an upper surface and a lower surface of the module board in at least one row at both sides of the buffer chip, in such a manner that the memory chips on the upper surface of the module board and the memory chips on the lower surface of the module board correspond to each other,
wherein the plurality of buses comprise a control signal bus having a split fly-by structure, and
wherein a control signal provided from the buffer chip is transmitted to the memory chips disposed on the upper and lower surfaces of the module board and connected to the first node, the second node, and the plurality of third nodes, via the control signal bus.

6. The memory module of claim 3, wherein the plurality of memory chips is disposed on an upper surface and a lower surface of the module board in at least one row at both sides of the buffer chip, in such a manner that the memory chips on the upper surface of the module board and the memory chips on the lower surface of the module board correspond to each other,
wherein the plurality of buses comprise a clock signal bus having a fly-by structure, and
wherein a clock signal provided from the buffer chip is transmitted to the memory chips disposed on the upper and lower surfaces of the module board and connected to the first node, the second node, and the plurality of third nodes, via the clock signal bus.

7. The memory module of claim 3, further comprising at least one data buffer chip mounted on the module board, the at least one data buffer chip buffering data exchanged between a memory controller and the plurality of memory chips.

8. The memory module of claim 1, wherein the plurality of memory chips is disposed on an upper surface and a lower surface of the module board in at least one row along the plurality of buses, in such a manner that the memory chips on the upper surface of the module board and the memory chips on the lower surface of the module board correspond to each other,
wherein the plurality of buses have a fly-by structure, and
wherein signals controlling the plurality of memory chips are transmitted to the memory chips disposed on the upper and lower surfaces of the module board and connected to the first node, the second node, and the plurality of third nodes, via the plurality of buses.

9. The memory module of claim 1, wherein the module board is a multilayer module board, and
wherein the plurality of buses is formed on at least one layer.

10. The memory module of claim 1, wherein the plurality of memory chips include double data rate type four (DDR4) type synchronous dynamic random access memory (SDRAM).

11. The memory module of claim 1, wherein the plurality of memory chips is packaged in one of a mono die structure, a dual die structure, or a stacked die structure using through silicon vias (TSVs).

12. A memory module comprising:
a plurality of buses;
a plurality of memory chips mounted on a module board, and connected to a first node, a second node, a plurality of third nodes, a fourth node, and a fifth node of the plurality of buses, respectively; and
a buffer chip mounted on the module board, wherein the first node and the second node respectively branch off to a first memory chip and a second memory chip, wherein the fourth node and the fifth node respectively branch off to a last memory chip and a second-to-last memory chip, wherein the third nodes branch off to the plurality of third memory chips, wherein a length of the bus between the first node of the first memory chip, and the second node of the second memory chip and a length of the bus between the fourth node of a fourth memory chip and the fifth node of a fifth memory chip are longer than lengths of any other buses of the plurality of buses; and wherein the first memory chip of the plurality of memory chips is closer to the buffer chip than any of the other memory chips of the plurality of memory chips.

13. The memory module of claim 12, wherein the plurality of memory chips is disposed on an upper surface and a lower surface of the module board in a first row and a second row, wherein memory chips connected to the first node, the second node, the fourth node, and the fifth node are arranged in the first row and memory chips connected to the third nodes are arranged in the second row;

wherein the plurality of buses comprises a fly-by structure, wherein signals controlling the plurality of memory chips are transmitted to memory chips disposed on the upper surface, the lower surface, or the upper and lower surfaces of the module board and connected to the first to fifth nodes, via the plurality of buses, and wherein a length of the plurality of buses between the first node and the second node and a length of the plurality of buses between the fourth node and the fifth node may be equal to or longer than lengths of the plurality of buses between adjacent nodes from among the second node and the third nodes and a length of the plurality of buses between the third node and the fourth node.

14. A memory module, comprising:
a module board;
a plurality of buses;
a first node on the plurality of buses connected to a first memory chip mounted on the module board;
a second node on the plurality of buses connected to a second memory chip mounted on the module board;
a third node on the plurality of buses connected to a third memory chip mounted on the module board; and
a buffer chip mounted on the module board, wherein a length of the bus between the first node of the first memory chip and the second node of the second memory chip is greater than a length of any other buses of the plurality of buses, and wherein the first memory chip of the plural memory chips is closer to the buffer chip than any of the other memory chips of the plurality of memory chips.

15. The memory module of claim 14, additionally comprising:
a fourth node on the plurality of buses connected to a fourth memory chip mounted on the module board,
wherein a distance along the plurality of buses between the third node and the fourth node is less than the distance between the first node and the second node.

16. The memory module of claim 14, wherein the first node is closest to a memory controller for controlling the memory module and the third node is farthest from the memory controller.

17. The memory module of claim 14, additionally comprising a plurality of additional nodes on the plurality of buses connected to a plurality of additional chips mounted in the module board, wherein the distance along the plurality of buses between the first node and the second node is greater than a distance along the plurality of buses between any two consecutive nodes of the plurality of additional nodes.

18. The memory module of claim 17, wherein the buffer chip controls operations of the first, second, and third memory chips, and
wherein the first memory chip, the second memory chip, the third memory chip, and each of the plurality of additional memory chips are disposed on an upper surface and a lower surface of the module board in at least one row at both sides of the buffer chip, in such a manner that the memory chips on the upper surface of the module board and the memory chips on the lower surface of the module board correspond to each other.

19. The memory module of claim 14, wherein the buffer chip controls operations of the first, second, and third memory chips.

20. The memory module of claim 19, wherein the plurality of buses comprises a command/signal bus having a split fly-by structure and a command/address signal provided from the buffer chip is transmitted to the first, second, and third memory Chips via the command/address signal bus.

* * * * *